US006420082B1

(12) United States Patent
Sato et al.

(10) Patent No.: US 6,420,082 B1
(45) Date of Patent: Jul. 16, 2002

(54) POSITIVE RESIST FLUID AND POSITIVE RESIST COMPOSITION

(75) Inventors: Kenichiro Sato; Kunihiko Kodama; Toshiaki Aoai, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/438,789

(22) Filed: Nov. 12, 1999

(30) Foreign Application Priority Data

Nov. 13, 1998 (JP) .......................................... 10-323783
Nov. 17, 1998 (JP) .......................................... 10-327054

(51) Int. Cl.[7] ............................................... G03F 7/039

(52) U.S. Cl. ..................... 430/270.1; 430/906; 430/910

(58) Field of Search .............................. 430/270.1, 906, 430/910

(56) References Cited

U.S. PATENT DOCUMENTS 5,698,361 A * 12/1997 Aoshima .................... 430/176
5,733,707 A * 3/1998 Kobayashi ............... 430/284.1
6,110,640 A * 8/2000 Kawamura et al. ...... 430/270.1
6,177,228 B1 * 1/2001 Allen et al. .............. 430/270.1
6,340,551 B1 * 1/2002 Miyake et al. .............. 430/156

* cited by examiner

*Primary Examiner*—John S. Chu

(57) ABSTRACT

The present invention provides a positive resist fluid excellent in the storage stability of the fluid and in defocus latitude depended on line pitch, and a positive photoresist composition for far ultraviolet exposure which forms a resist pattern having excellent defocus latitude depended on line pitch and has excellent sensitivity to short-wavelength exposure lights. The positive resist fluid comprises a resin which contains repeating units represented by formula (I) as defined in the specification, a photo-acid generator, and a solvent and the positive photoresist composition for far ultraviolet exposure comprises a resin which contains both alkali-soluble groups protected by groups containing an alicyclic hydrocarbon structure and represented by at least one of formulae (pI) to (pVI) and groups represented by formula (qI):

$$—A—X—R_5$$

as defined in the specification.

7 Claims, No Drawings

POSITIVE RESIST FLUID AND POSITIVE RESIST COMPOSITION

FIELD OF THE INVENTION

The present invention relates to a positive resist fluid for use in ultramicrolithographic processes such as the production of ULSIs and high-capacity microchips and in other photofabrication processes, more particularly, a positive resist fluid excellent in the storage stability of the fluid and in defocus latitude depended on line pitch.

The present invention further relates to a positive photoresist composition for use in ultramicrolithographic processes such as the production of ULSIs and high-capacity microchips and in other photofabrication processes, more particularly, a positive photoresist composition capable of forming an ultrafine pattern with a light in the far ultraviolet region, including an excimer laser light, and especially with a light having a wavelength of 250 nm.

BACKGROUND OF THE INVENTION

The degree of integration in integrated circuits is increasing more and more in recent years, and it has become necessary to form an ultrafine pattern having a line width of 0.5 μm or smaller in the production of semiconductor substrates for ULSIs and the like. With this trend, the exposure light wavelengths of illuminators for use in photolithography are increasingly becoming shorter so as to meet the above requirement, and the use of excimer laser lights having shorter wavelengths among far ultraviolet rays (e.g., XeCl, KrF, and ArF excimer laser lights) has now come to be investigated.

For use in lithographic pattern formation in the above wavelength region are chemical amplification type resists.

In general, the chemical amplification type resists are roughly divided into three groups, i.e., 2-component systems, 2.5-component systems, and 3-component systems. The 2-component systems comprise a combination of a compound which generates an acid upon photodecomposition (hereinafter referred to as a photo-acid generator) and a binder resin. This binder resin has, within its molecule, groups which decompose by the action of an acid to enhance the solubility of the resin in an alkaline developing solution (the groups being referred to also as acid-decomposable groups). The 2.5-component systems comprise such a 2-component system which further contains a low-molecular compound having an acid-decomposable group. The 3-component systems comprise a photo-acid generator, an alkali-soluble resin, and the above low-molecular compound.

Although the chemical amplification type resists are suitable for use as photoresists for irradiation with ultraviolet or far ultraviolet rays, they need to meet property requirements for use with a particular illuminator among ultraviolet and far ultraviolet illuminators. For example, a resist composition has been proposed which contains a polymer obtained by incorporating acetal or ketal groups as protective groups into a hydroxystyrene polymer and showing reduced light absorption especially in the case of using 248-nm KrF excimer laser light. Examples thereof are given in, e.g., JP-A-2-141636 (the term "JP-A" as used herein means an "unexamined published Japanese patent application"), JP-A-2-19847, JP-A-4-219757, and JP-A-5-281745. Furthermore, a similar composition in which a t-butoxycarbonyloxy or p-tetrahydropyranyloxy group is used as an acid-decomposable group is proposed in, e.g., JP-A-2-209977, JP-A-3-206458, and JP-A-2-19847.

Although these prior art compositions are suitable for irradiation with 248-nm KrF excimer laser light, they show insufficient sensitivity when an ArF excimer laser is used as an illuminator because they essentially have still too high an absorbance. These compositions further have drawbacks accompanying the low sensitivity, such as, e.g., deteriorations in resolution, focus latitude, pattern profile, etc. Those prior art compositions hence still necessitate improvements in many points.

On the other hand, a photoresist composition for an ArF illuminator has been proposed which comprises a combination of a (meth)acrylic resin even more reduced in absorption than partially hydroxylated styrene resins and a compound generating an acid upon light irradiation. This type of composition is disclosed in, e.g., JP-A-7-199467 and JP-A-7-252324. In particular, JP-A-6-289615 discloses a resin containing acrylic acid units each having an organic group having a tertiary carbon atom and bonded to one of the oxygen atoms of the carboxyl group through an ester bond.

JP-A-7-234511 discloses an acid-decomposable resin containing repeating units derived from an acrylic or fumaric ester. However, the resist composition disclosed therein is insufficient in pattern profile, adhesion to substrates, etc. Thus, none of the prior art photoresist compositions proposed so far for use with an ArF illuminator has satisfactory performances.

Furthermore, resins in which an alicyclic hydrocarbon structure has been incorporated for the purpose of imparting dry-etching resistance have been proposed.

In JP-A-9-73173, JP-A-9-90637, and JP-A-10-161313 is described a resist material containing an acid-responsive compound which contains both alkali-soluble groups each protected by a structure containing an alicyclic group and structural units which are made alkali-soluble upon elimination of the alkali-soluble groups by the action of an acid.

JP-A-9-90638 discloses an energy-ray-sensitive material containing a polymer having sulfonamide structures in side chains and the main chain thereof. There is a description therein to the effect that a chemical amplification type resist which is capable of accurately giving a desired pattern and undergoes reduced pattern shrinkage upon elimination of protective groups is obtained due to the use of the polymer.

Although various resins having acid-decomposable groups have been investigated for use in chemical amplification type photoresists as described above, there has been room for improvement. Specifically, the conventional chemical amplification type photoresists still have problems, for example, that the photoresists when stored in a liquid state, deteriorate in resist performance (deterioration of resist-fluid storage stability).

Since recent devices tend to contain various patterns, resists are required to have various performances. One of these i s defocus latitude depended on line pitch (Dense Vias). Adevice has an area where lines are densely disposed and a pattern area where lines are separated by spaces wider than the lines, and further has isolated lines. It is, therefore, important to resolve various lines with high reproducibility. However, to reproduce such various lines is not always easy because of optical factors, and how to attain the desired reproduction based on an improvement in resist has remained unclear.

Moreover, although resins having an alicyclic hydrocarbon structure incorporated therein for imparting dry-etching resistance have been proposed, this type of system has exceedingly high hydrophobicity as an adverse influence of the incorporation of the alicyclic hydrocarbon structure. As a result, the resist containing this resin has drawbacks, for example, that the resist is difficult to develop with an aqueous tetramethylammonium hydroxide (hereinafter referred to as TMAH) solution, which has conventionally been used extensively as a resist developing solution, and the resist may peel off the substrate during development.

Measures have been investigated in coping with such a hydrophobized resist. Among these is to incorporate an organic solvent such as, e.g., isopropyl alcohol, into a developing solution. Although such measures give some degree of results, several problems still remain unsolved, e.g., the fear of resist film swelling and process troublesomeness.

With respect to an approach based on resist improvement, many attempts have been made to compensate for various hydrophobic alicyclic hydrocarbon structures by incorporating hydrophilic groups.

A technique which has been generally employed is to copolymerize acrylic or methacrylic acid as a monomer having a carboxyl structure with a monomer having an alicyclic hydrocarbon group. This measure is effective in improving adhesion to substrates with increasing amount of carboxylic groups incorporated. However, the resist obtained by this technique has many problems, for example, that it has impaired dry-etching resistance and the resist film undergoes considerable thickness reduction, leaving the above-described problems unsolved. JP-A-7-234511 proposes a technique for eliminating the problem concerning developability by copolymerizing a monomer having in the molecule a hydroxyl or cyano group in place of a carboxyl group, such as HEMA or acrylonitrile, with a monomer having an alicyclic hydrocarbon group. This technique, however, is utterly insufficient.

On the other hand, a technique for imparting dry-etching resistance by utilizing an alicyclic hydrocarbon structure as a polymer main chain has been investigated, besides the above-described technique in which an alicyclic hydrocarbon structure is incorporated into a side chain of an acrylate monomer. However, this system also has the above problem, and improvements based on similar approaches have been investigated.

For example, the incorporation of hydroxyl groups into the backbone of a norbornene polymer for the purpose of imparting adhesion to substrates is reported in *Journal of Photopolymer Science and Technology*, Vol.10, 1997, pp.529–534 and *Journal of Photopolymer Science and Technology*, Vol.10, 1997, pp.521–528. However, no satisfactory results have been obtained in both developability and adhesion to substrates.

In SPIE, Vol.3049, pp.92–105 (1988) is disclosed a composition containing a polymer which comprises either a polymer formed by the ring-opening polymerization of norbornene or a polymer having norbornene rings in the backbone thereof and which has carboxyl groups and t-butyl ester groups. However, this technique also has a drawback that the composition is impractical because it is insufficient in both of adhesion to substrates and developability with standard developing solutions.

European Patent Publication No. 789278 A2 discloses a composition containing a resin which comprises either a polymer formed by the ring-opening polymerization of norbornene or a polymer having norbornene rings in the backbone thereof and which contains acid-decomposable groups and carboxyl groups. WO 97/33198 discloses a photoresist composition containing a resin obtained by polymerizing a monomer having a norbornene ring having an acid-decomposable group. JP-A-9-274318 discloses a photoresist composition containing a carboxylic acid.

Furthermore, JP-A-9-73173, JP-A-9-90637, and JP-A-10-161313 describe a resist material containing an acid-responsive compound which contains both alkali-soluble groups each protected by a structure containing an alicyclic group and structural units which are made alkali-soluble upon elimination of the alkali-soluble groups by the action of an acid.

As described above, the resins containing acid-decomposable groups which are used in photoresists for exposure to far ultraviolet rays generally contain alicyclic hydrocarbon groups in the molecule besides the acid-decomposable groups. Because of this, these resins are hydrophobic and have problems attributable thereto. Although investigations have been made on various means such as the above-described ones for mitigating these problems, the techniques described above are still insufficient in many points and further improvements are desired.

Since recent devices tend to contain various patterns, resists are required to have various performances. One of these is defocus latitude depended on line pitch. A device has an area where lines are densely disposed and a pattern area where lines are separated by spaces wider than the lines, and further has isolated lines. It is, therefore, important to resolve various lines with high reproducibility. However, to reproduce such various lines is not always easy because of optical factors, and how to attain the desired reproduction based on an improvement in resist has remained unclear. In particular, the above-described resist systems containing a resin having alicyclic groups show a considerable performance difference between a pattern comprising isolated lines and a pattern comprising densely disposed lines, and an improvement in this point is desired.

SUMMARY OF THE INVENTION

Accordingly, an object of the present invention is to eliminate the problems of techniques for improving the performances inherent in the above-described microphotofabrication in which a far ultraviolet light, especially KrF or ArF excimer laser light, is used. Specifically, the object is to provide a positive resist fluid excellent in the storage stability of the fluid and in defocus latitude depended on line pitch.

Another object of the present invention is to provide a positive photoresist composition free from the problems of techniques for improving the performances inherent in the above-described microphotofabrication in which a far ultraviolet light, especially ArF excimer laser light, is used. Specifically, the object is to provide a positive photoresist composition for far ultraviolet exposure which forms a resist pattern having excellent defocus latitude depended on line pitch and has excellent sensitivity to short-wavelength exposure lights.

The present inventors made intensive investigations on constituent materials for chemical amplification type positive resist fluids. As a result, they have found that the first object of the present invention is accomplished by using a specific acid-decomposable resin. The present invention has been achieved based on this finding.

Namely, the first object is accomplished with the following constitution.

(1) A positive resist fluid comprising a resin which contains repeating units represented by the following general formula (I) and comes to have an increased rate of dissolution in an alkaline developing solution by the action of an acid, a compound which generates an acid upon irradiation with actinic rays or a radiation, and a solvent:

General Formula I

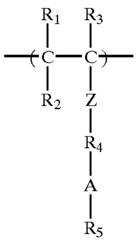

wherein $R_1$ to $R_3$ each independently represents a hydrogen atom, an alkyl group, a halogen atom, a cyano group, or a group represented by —Z—$R_4$—A—$R_5$, Z represents a single bond, an ether group, an ester group, an amide group, an alkylene group, or a bivalent group consisting of a combination of two or more of these, $R_4$ represents a single bond, an alkylene group, an arylene group, or a bivalent group consisting of a combination of two or more of these, $R_5$ represents an alkyl group, an aryl group, or an aralkyl group, and A represents any one of the following functional groups.

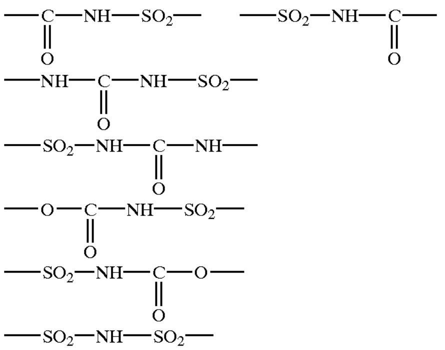

The present inventors made intensive investigations on constituent materials for chemical amplification type positive resist compositions. As a result, they have found that the second object of the present invention is accomplished by using a specific acid-decomposable resin. The present invention has been achieved based on this finding.

Namely, the second object is accomplished with the following constitution.

A positive photoresist composition for far ultraviolet exposure which comprises (i) a compound which generates an acid upon irradiation with actinic rays or a radiation and (ii) a resin which contains both alkali-soluble groups protected by groups containing an alicyclic hydrocarbon structure and represented by at least one of the following general formulae (pI) to (pVI) and groups represented by general formula (qI): —A—X—$R_5$, and which decomposes by the action of an acid to have enhanced solubility in an alkali:

(pI)

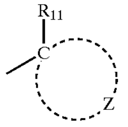

(pII)

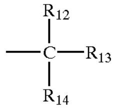

(pIII)

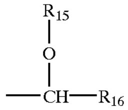

(pIV)

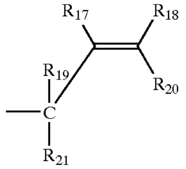

(pV)

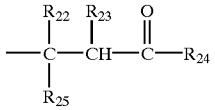

(pVI)

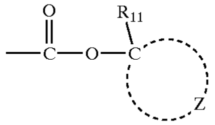

provided that in general formulae (pI) to (pVI), $R_{11}$ represents a methyl, ethyl, n-propyl, isopropyl, n-butyl, isobutyl, or sec-butyl group; Z represents a group of atoms necessary for forming an alicyclic hydrocarbon group in cooperation with the carbon atom;

$R_{12}$ to $R_{16}$ each independently represents a linear or branched alkyl group having 1 to 4 carbon atoms or an alicyclic hydrocarbon group, provided that at least one of $R_{12}$ to $R_{14}$ or either of $R_{15}$ and $R_{16}$ represents an alicyclic hydrocarbon group;

$R_{17}$ to $R_2$, each independently represents a hydrogen atom, a linear or branched alkyl group having 1 to 4 carbon atoms, or an alicyclic hydrocarbon group, provided that at least one of $R_{17}$ to $R_{21}$ represents an alicyclic hydrocarbon group and either of $R_{19}$ and $R_{21}$ represents a linear or branched alkyl group having 1 to 4 carbon atoms or an alicyclic hydrocarbon group; and $R_{22}$ to $R_{25}$ each independently represents a linear or branched alkyl group having 1 to 4 carbon atoms or an alicyclic hydrocarbon group, provided that at least one of $R_{22}$ to $R_{25}$ represents an alicyclic hydrocarbon group, and in general formula (qI), A represents one member or a combination of two or more members selected from the group consisting of a single bond, an alkylene group, a substituted alkylene group, an ether group, a thioether group, a carbonyl group, and an ester group;

X represents —$NHSO_2$—, —$SO_2NH$—, —$SO_2NHSO_2$—, —NH(C═O)$NHSO_2$—, —(C═O)

$NHSO_2$—, —$SO_2NH(C{=}O)$—, —$SO_2NH(C{=}O)NH$—, —$O(C{=}O)NHSO_2$—, or —$SO_2NH(C{=}O)O$—; and $R_5$ represents an alkyl group, a substituted alkyl group, an alicyclic hydrocarbon group, or a substituted alicyclic hydrocarbon group.

DETAILED DESCRIPTION OF THE INVENTION

The compounds used in the positive resist fluid of the present invention will be explained below in detail.

Resin containing repeating units represented by general formula (I) and coming to have increased rate of dissolution in alkaline developing solution by the action of acid (referred to also as acid-decomposable resin):

The repeating units represented by general formula (I) are characterized in that they each has at least one group represented by —Z—$R_4$—A—$R_5$.

In general formula (I), examples of each alkyl group include linear, branched, and cyclic alkyl groups, which each may have one or more substituents. The linear and branched alkyl groups are preferably those having 1 to 12 carbon atoms, more preferably those having 1 to 10 carbon atoms. The most preferred examples thereof include methyl, ethyl, propyl, isopropyl, n-butyl, isobutyl, sec-butyl, t-butyl, pentyl, hexyl, heptyl, octyl, nonyl, and decyl. Examples of the cyclic alkyl groups include those having 3 to 30 carbon atoms. Specific examples thereof include cyclopropyl, cyclopentyl, cyclohexyl, adamantyl, norbornyl, bornyl, tricyclodecanyl, dicyclopentenyl, norbornane-epoxy, menthyl, isomenthyl, neomentyl, tetracyclododecanyl, and steroid residues.

Examples of the halogen atom include chlorine, bromine, fluorine, and iodine atoms.

Examples of the aryl group include optionally substituted aryl groups having 6 to 10 carbon atoms. Specific examples thereof include phenyl, tolyl, and naphthyl.

Examples of the aralkyl group include optionally substituted aralkyl groups having 7 to 20 carbon atoms. Specific examples thereof include benzyl, phenethyl, and cumyl.

Examples of the arylene group include optionally substituted arylene groups having 6 to 10 carbon atoms. Specific examples thereof include phenylene, tolylene, and naphthylene.

Examples of the substituents for the alkyl, aryl, aralkyl, and arylene groups described above include carboxyl, acyloxy groups, cyano, alkyl groups, substituted alkyl groups, halogen atoms, hydroxyl, alkoxy groups, acetylamido, alkoxycarbonyl groups, and acyl groups. Examples of the alkyl groups include lower alkyl groups such as methyl, ethyl, propyl, isopropyl, butyl, cyclopropyl, cyclobutyl, and cyclopentyl. Examples of the substituents for the substituted alkyl groups include hydroxyl, halogen atoms, and alkoxy groups. Examples of the alkoxy groups include those having 1 to 4 carbon atoms, such as methoxy, ethoxy, propoxy, and butoxy. Examples of the acyloxy groups include acetoxy. Examples of the halogen atoms include chlorine, bromine, fluorine, and iodine atoms.

Examples of the alkylene groups include those represented by the following formula.

$$-[C(R_a)(R_b)]_r-$$

In the above formula, $R_a$ and $R_b$ may be the same or different and each represents a hydrogen atom, an alkyl group, a substituted alkyl group, a halogen atom, a hydroxyl group, or an alkoxy group. The alkyl group is preferably a lower alkyl group such as, e.g., methyl, ethyl, propyl, isopropyl, or butyl, and is more preferably selected from methyl, ethyl, propyl, and isopropyl. Examples of the substituent(s) for the substituted alkyl group include hydroxyl, halogen atoms, and alkoxy groups. Examples of the alkoxy groups include those having 1 to 4 carbon atoms, such as methoxy, ethoxy, propoxy, and butoxy. Examples of the halogen atoms include chlorine, bromine, fluorine, and iodine atoms. Symbol r represents an integer of 1 to 10.

Specific examples of the repeating units represented by general formula (I) are shown below. However, the contents of the present invention should not be construed as being limited by these examples.

(1)

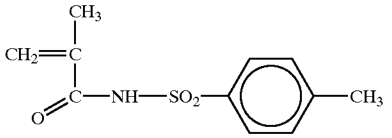

(2)

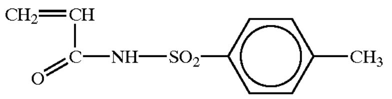

(3)

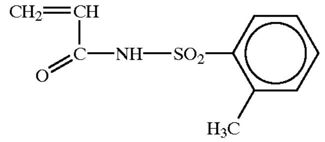

(4)

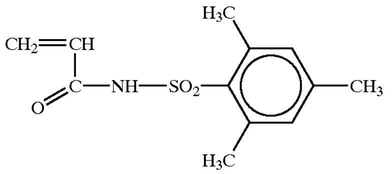

(5)

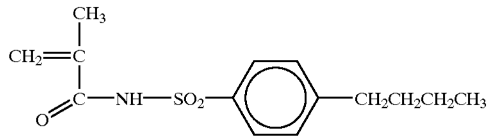

(6)

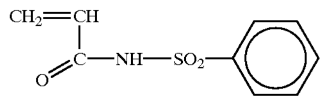

(7)

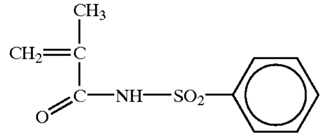

(8)

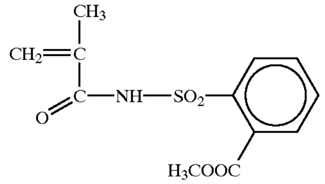

-continued
(9)
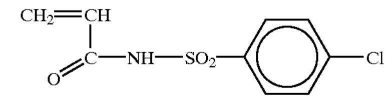
(10)
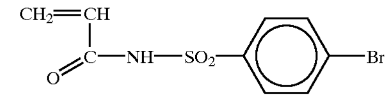
(11)
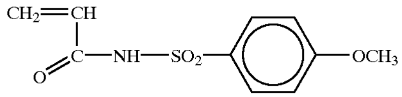
(12)
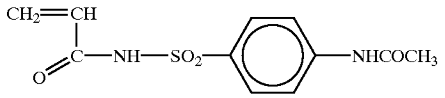
(13)
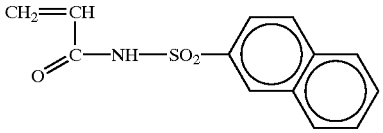
(14)
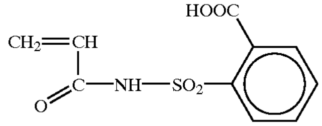
(15)
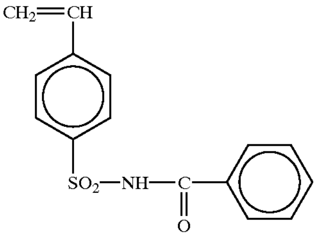
(16)
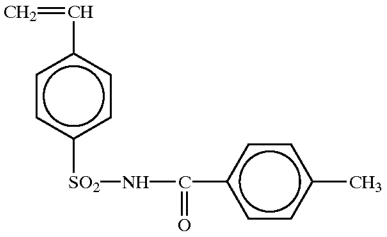
(17)
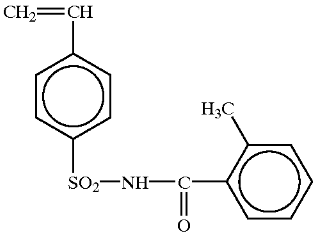
-continued
(18)
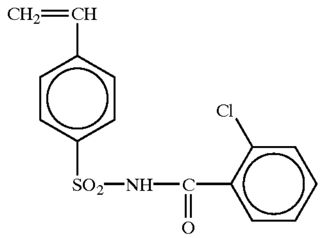
(19)
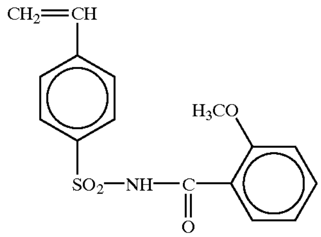
(20)
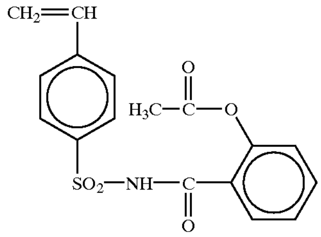
(21)
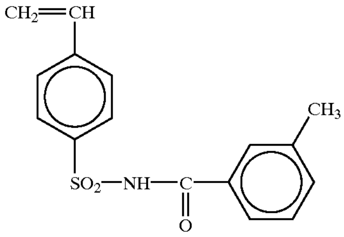
(22)
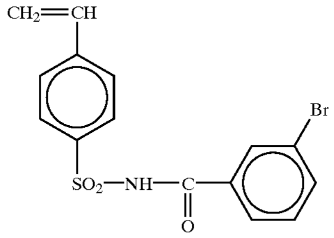
(23)
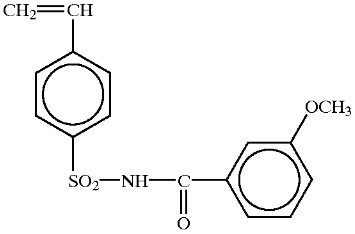

-continued
(24)
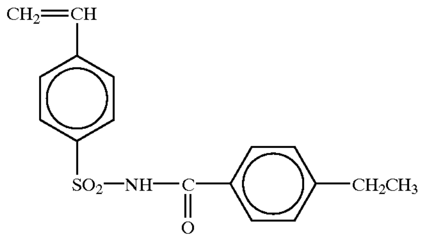
(25)
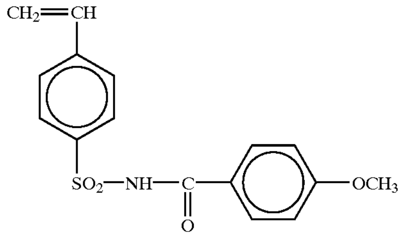
(26)
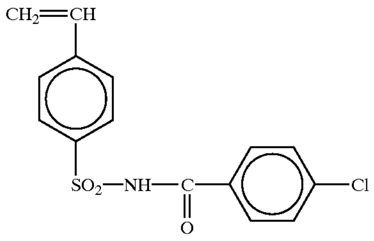
(27)
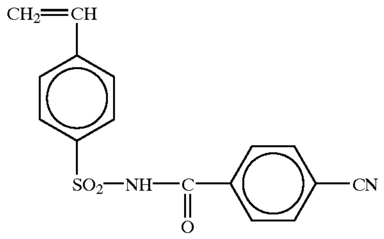
(28)
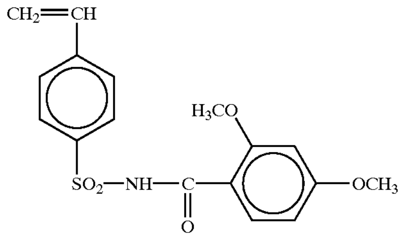
(29)
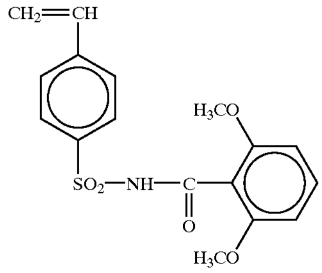
-continued
(30)
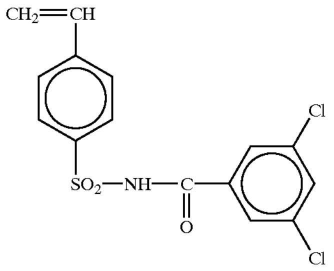
(31)
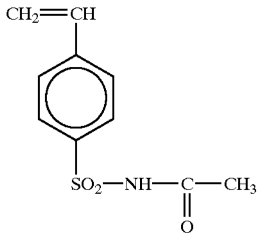
(32)
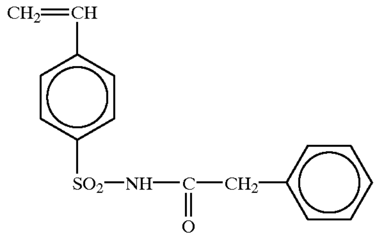
(33)
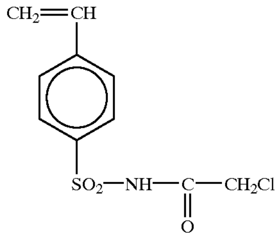
(34)
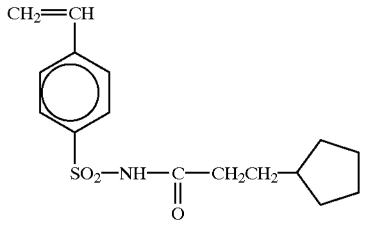
(35)
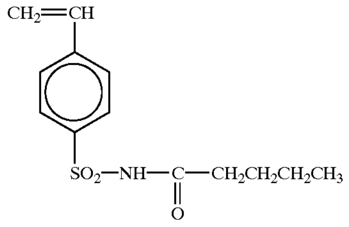

-continued
(36)
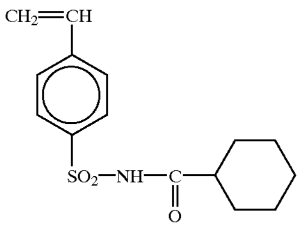
(37)
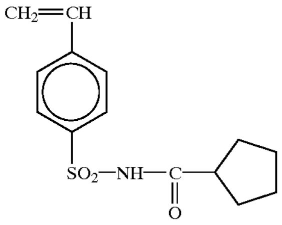
(38)
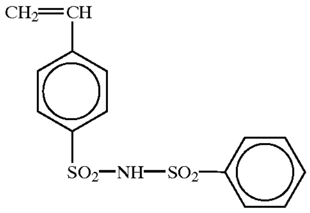
(39)
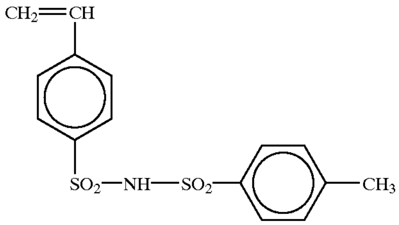
(40)
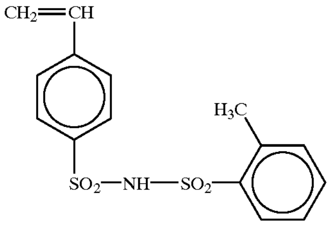
(41)
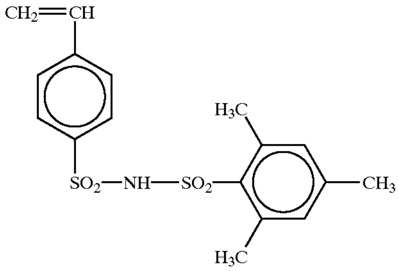
-continued
(42)
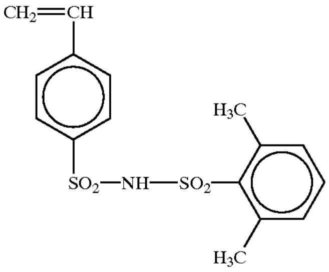
(43)
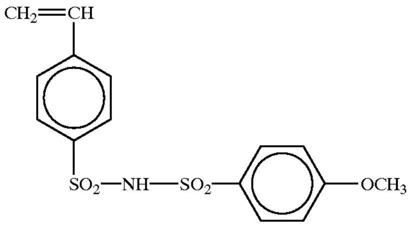
(44)
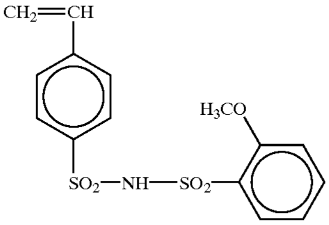
(45)
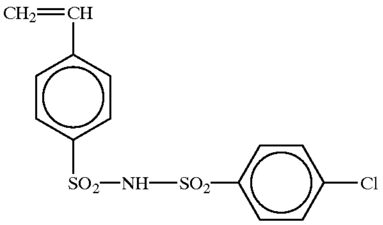
(46)
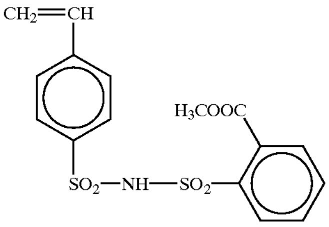
(47)
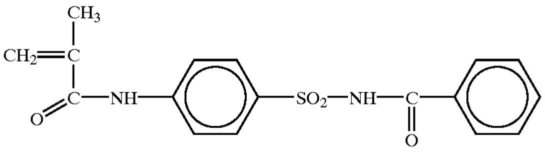
(48)
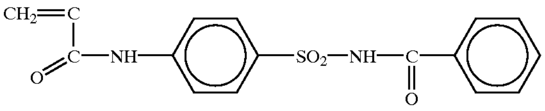

-continued
(49)
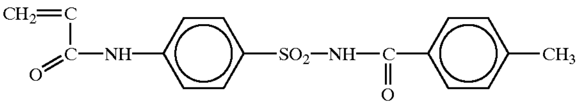
(50)
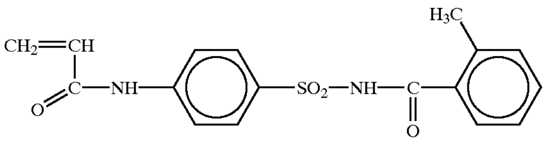
(51)
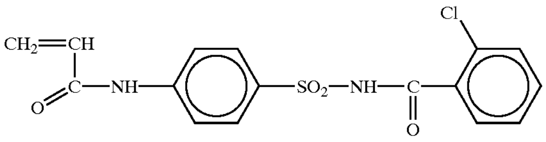
(52)
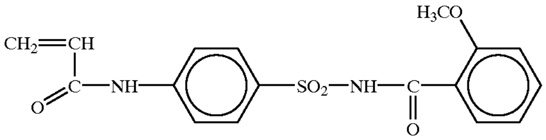
(53)
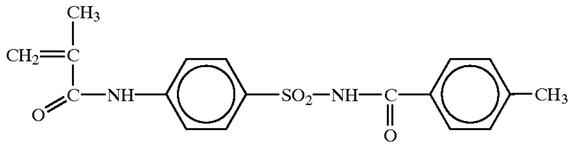
(54)
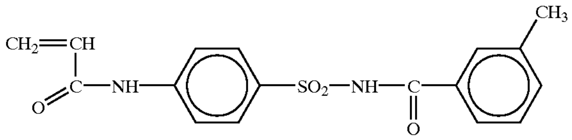
(55)
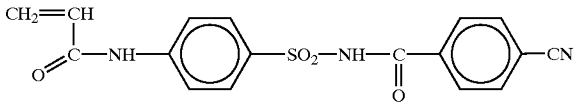
(56)
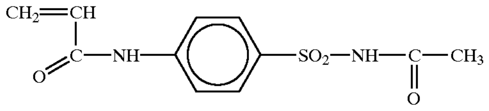
(57)
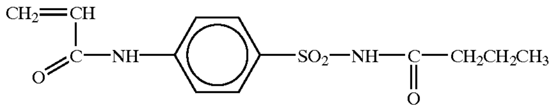
(58)
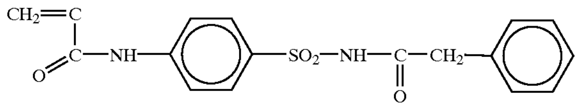
-continued
(59)
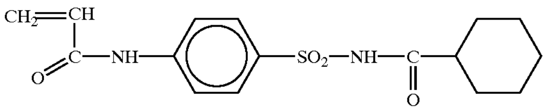
(60)
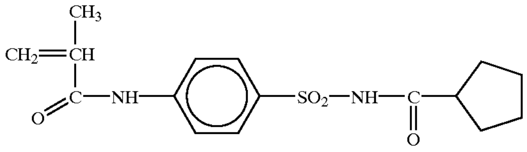
(61)
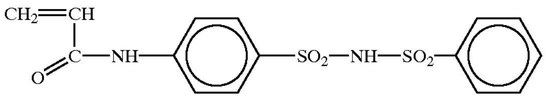
(62)
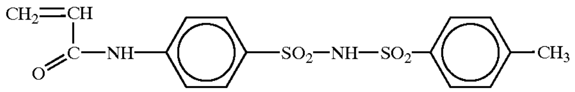
(63)
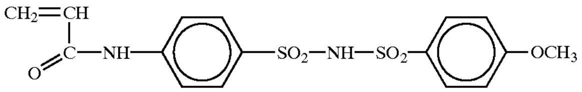
(64)
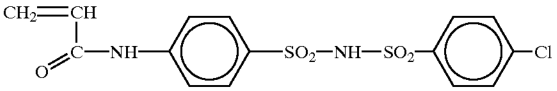
(65)
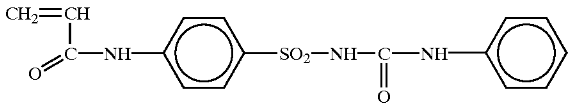
(66)
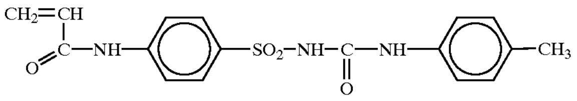
(67)
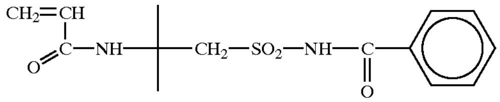
(68)
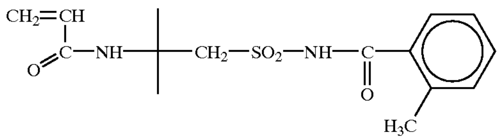
(69)
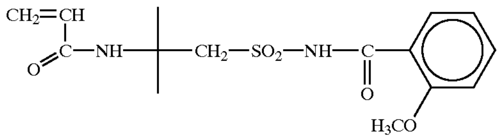

-continued
(70)
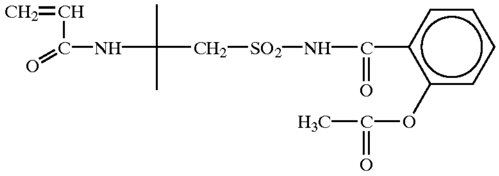
(71)
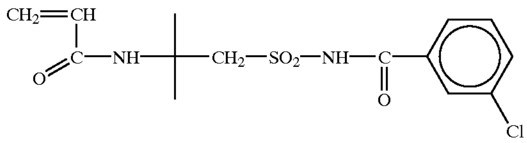
(72)
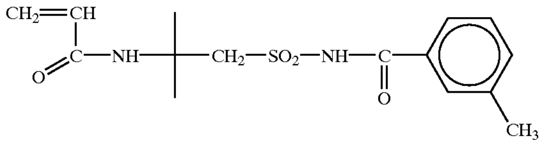
(73)
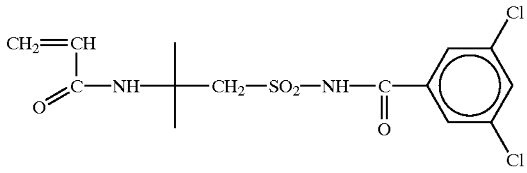
(74)
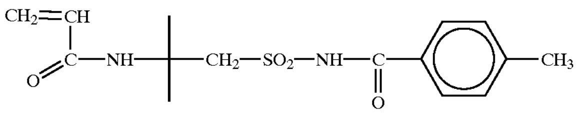
(75)
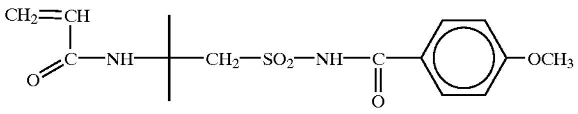
(76)
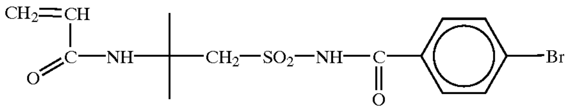
(77)
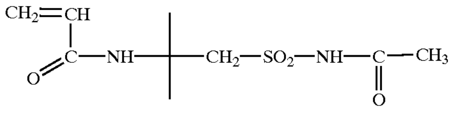
(78)
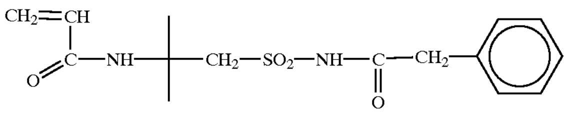
(79)
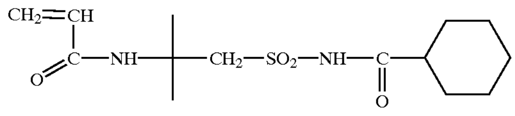
-continued
(80)
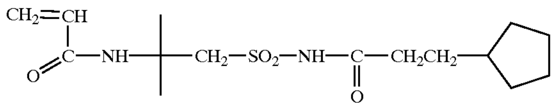
(81)
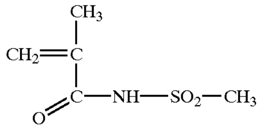
(82)
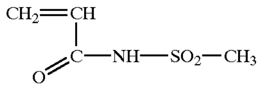
(83)
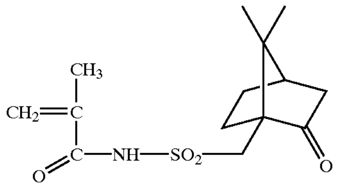
(84)
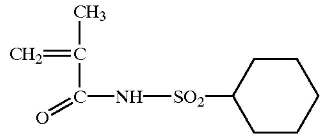
(85)
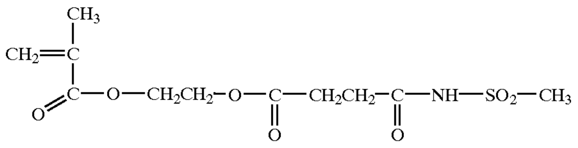
(86)
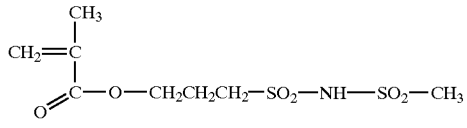
(87)
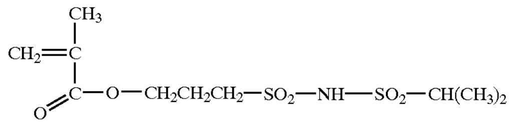
(88)
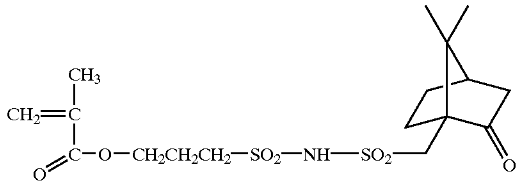
(89)
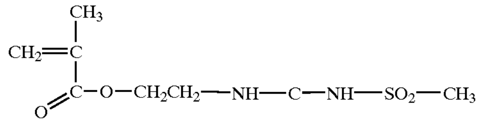

-continued
(90)
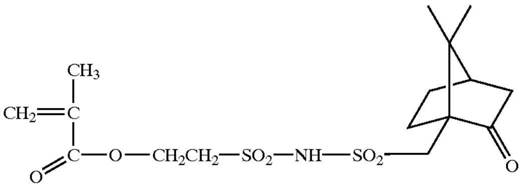
(91)
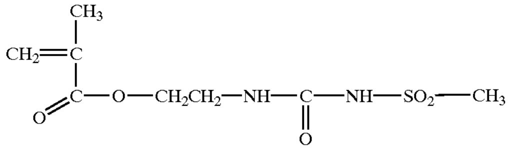
(92)
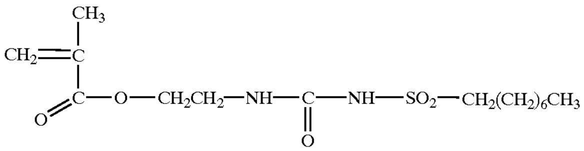
(93)
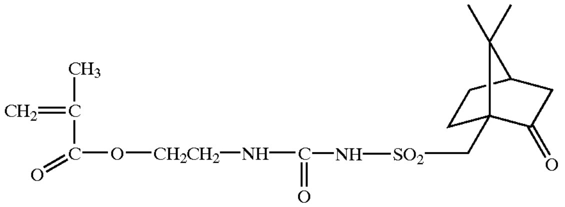
(94)
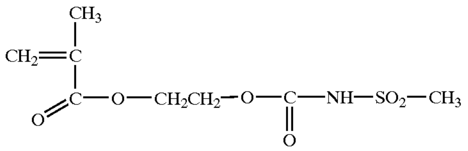
(95)
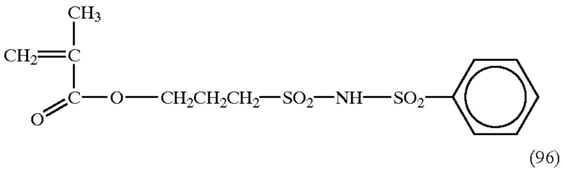
(96)
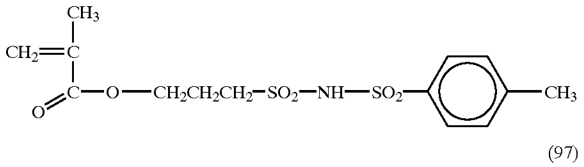
(97)
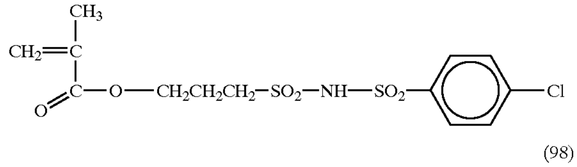
(98)
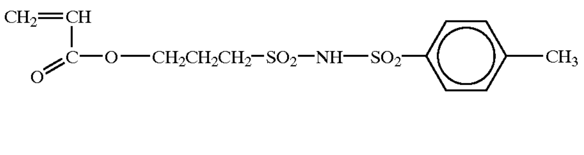
-continued
(99)
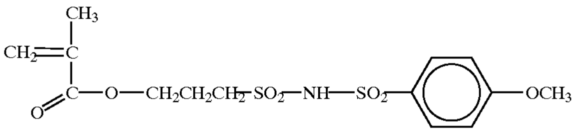
(100)
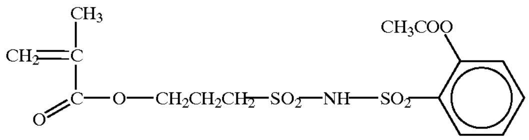
(101)
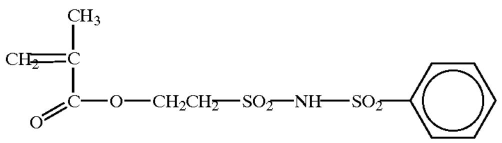
(102)
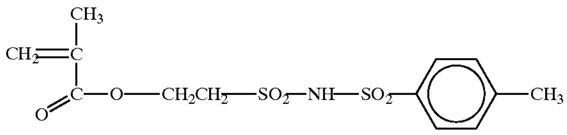
(103)
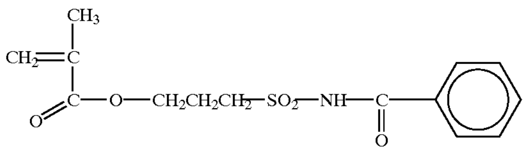
(104)
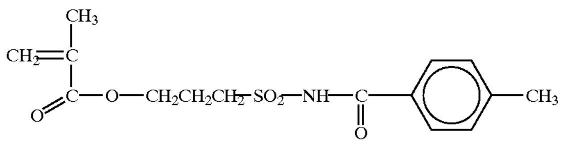
(105)
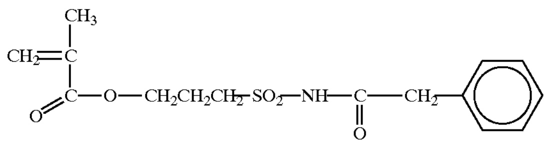
(106)
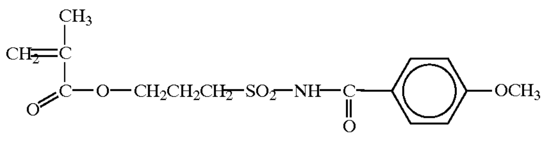
(107)
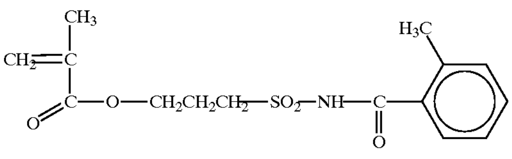

-continued (108)

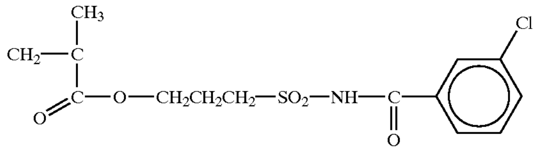

(109)

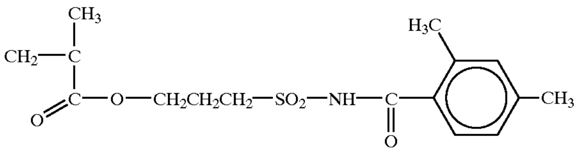

(110)

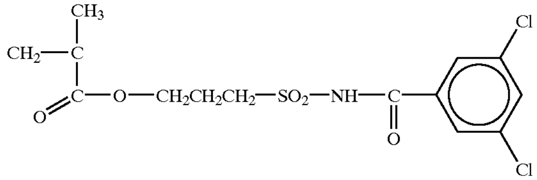

The resin according to the present invention contains groups which decompose by the action of an acid (referred to also as acid-decomposable groups).

Examples of the groups decomposing by the action of an acid include groups represented by —$COOA^0$ and groups represented by —O—$B^0$. Examples of groups containing these groups include groups represented by —$R^0$—$COOA^0$ or —Ar—O—$B^0$.

In the above formulae, $A^0$ represents —$C(R^{01})(R^{02})(R^{03})$, —$Si(R^{01})(R^{02})(R^{03})$, —$C(R^{04})(R^{05})$—O—$R^{06}$, or a lactone group. $B^0$ represents —$A^0$ or —CO—O—$A^0$.

$R^{01}$, $R^{02}$, $R^{03}$, $R^{04}$, and $R^{05}$ may be the same or different and each represents a hydrogen atom, an alkyl group, a cycloalkyl group, an alkenyl group, an aralkyl group, or an aryl group, and $R^{06}$ represents an alkyl group, a cycloalkyl group, or an aryl group. However, at least two of $R^{01}$ to $R^{03}$ are not hydrogen atoms; and two of $R^{01}$ to $R^{03}$ may be bonded to each other to form a ring, and two of $R^{04}$ to $R^{06}$ may be bonded to each other to form a ring. $R^0$ represents a single bond or an optionally substituted, aliphatic or aromatic hydrocarbon group having a valence of 2 or higher, and —Ar— represents an optionally substituted, mono- or polycyclic aromatic group having a valence of 2 or higher.

Preferred examples of the alkyl group include those having 1 to 4 carbon atoms, such as methyl, ethyl, propyl, n-butyl, sec-butyl, and t-butyl. Preferred examples of the cycloalkyl group include those having 3 to 10 carbon atoms, such as cyclopropyl, cyclobutyl, cyclohexyl, and adamantyl. Preferred examples of the alkenyl group include those having 2 to 4 carbon atoms, such as vinyl, propenyl, allyl, and butenyl. Preferred examples of the aryl group include those having 6 to 14 carbon atoms, such as phenyl, xylyl, toluyl, cumenyl, naphthyl, and anthracenyl. Examples of the cycloalkyl group include those having 3 to 30 carbon atoms, such as cyclopropyl, cyclopentyl, cyclohexyl, adamantyl, norbornyl, bornyl, tricyclodecanyl, dicyclopentenyl, norbornane-epoxy, menthyl, isomenthyl, neomenthyl, tetracyclododecanyl, and steroid residues. Examples of the aralkyl group include optionally substituted aralkyl groups having 7 to 20 carbon atoms, such as benzyl, phenethyl, and cumyl.

Examples of the substituents include hydroxyl, halogen atoms (fluorine, chlorine, bromine, and iodine), nitro, cyano, the aforementioned alkyl groups, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the aforementioned alkenyl groups, alkenyloxy groups such as vinyloxy, propenyloxy, allyloxy, and butenyloxy, the aforementioned aryl groups, aryloxy groups such as phenoxy, and aryloxycarbonyl groups such as benzoyloxy.

Examples of the lactone group include groups of the following structures.

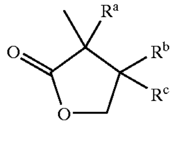
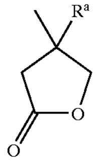
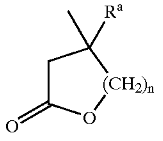

In the above formulae, $R^a$, $R^b$, and $R^c$ each independently represents a hydrogen atom or an alkyl group having 1 to 4 carbon atoms, and n represents an integer of 2 to 4.

In the case where an ArF excimer laser is used as an illuminator for exposure, the groups decomposing by the action of an acid are preferably ones represented by —C(=O)—$X_1$—$R_0$. In this formula, examples of $R_0$ include tertiary alkyl groups such as t-butyl and t-amyl, isobornyl, 1-alkoxyethyl groups such as 1-ethoxyethyl, l-butoxyethyl, 1-isobutoxyethyl, and 1-cyclohexyloxyethyl, alkoxymethyl groups such as 1-methoxyymethyl and 1-ethoxymethyl, tetrahydropyranyl, tetrahydrofuranyl, trialkylsilyl groups, 3-oxocyclohexyl, and the aforementioned lactone groups. $X^1$ represents. an oxygen atom or a sulfur atom, and is preferably an oxygen atom.

The resin containing at least groups represented by general formula (I) and acid-decomposable groups needs to have a structure suitably selected according to the exposure light to be used.

In the case where the exposure light is KrF excimer laser light having a wavelength of 248 nm, the resin preferably contains repeating units having a benzene ring, such as styrene-derived repeating units, as major repeating units.

In the case where the exposure light is ArF excimer laser light having a wavelength of 193 nm, repeating units having a benzene ring cannot be used. In this case, the resin is preferably one containing alicyclic structures, as major repeating units, in the backbone or side chains thereof.

The acid-decomposable resin suitable for use in the case where the exposure light is KrF excimer laser light having a wavelength of 248 nm will be explained below.

The base resin having, in side chains thereof, repeating units represented by general formula (I) and groups decomposing by the action of an acid is an alkali-soluble resin which has —OH or —COOH groups, preferably —$R^0$-COOH or —Ar—OH groups, in side chains thereof.

Such alkali-soluble resins have an alkali dissolution rate, as measured with 0.261 N tetramethylammonium hydroxide (TMAH) at 23° C., of preferably 170 A/sec or higher, more preferably. 330 A/sec or higher (wherein A means angstrom).

Preferred from the standpoint of attaining a rectangular profile are alkali-soluble resins which highly transmit far ultraviolet and excimer laser lights. Specifically, alkali-soluble resins whose 1 μm-thick films have a transmittance at 248 nm of 35% or higher are preferred.

Especially preferred alkali-soluble resins from these standpoints are poly (o-, m-, or p-hydroxystyrene), copolymers of these hydroxystyrenes, hydrogenated poly (hydroxystyrene)s, halogen- or alkyl-substituted poly (hydroxystyrene)s, partially O-alkylated or O-acylated poly (hydroxystyrene)s, styrene/hydroxystyrene copolymers, α-methylstyrene/hydroxystyrene copolymers, and hydrogenated novolak resins.

The resin having acid-decomposable groups for use in the present invention can be obtained by reacting an alkali-soluble resin with a precursor of acid-decomposable groups or by copolymerizing a monomer giving an alkali-soluble resin and having an acid-decomposable group bonded thereto with any of various monomers, as disclosed in European Patent 254,853, JP-A-2-25850, JP-A-3-223860, JP-A-4-251259, etc.

Specific examples of the acid-decomposable resin suitable for use in the case where the exposure light is KrF excimer laser light having a wavelength of 248 nm are shown below. However, the resin for use in the present invention should not be construed as being limited to these examples.

(i)

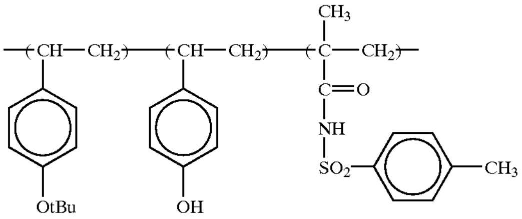

(ii)

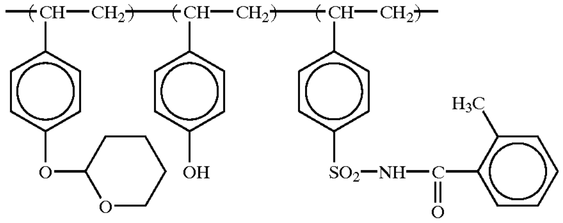

(iii)

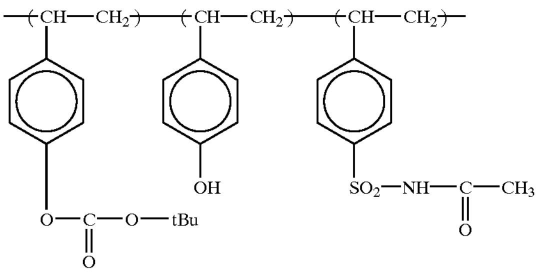

(iv)

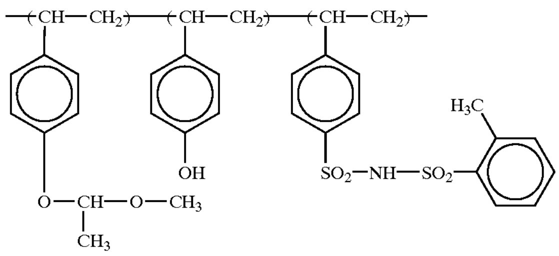

(v)

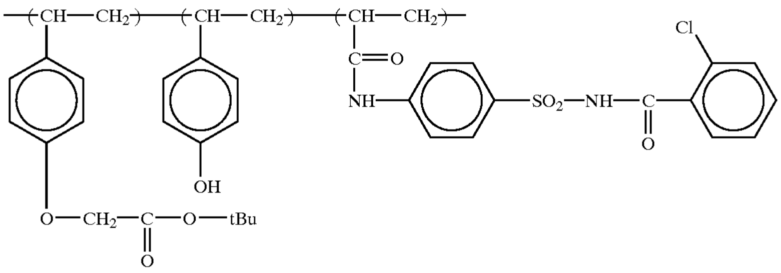

(vi)

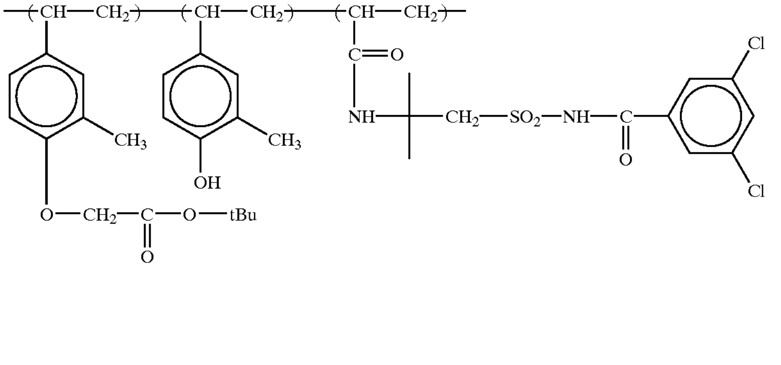

-continued
(vii)
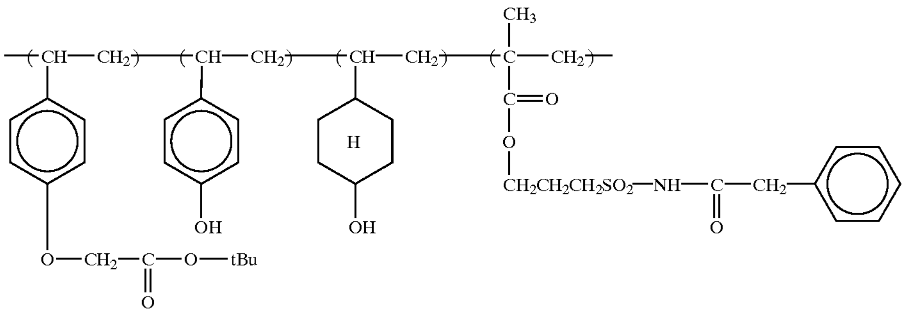
(viii)
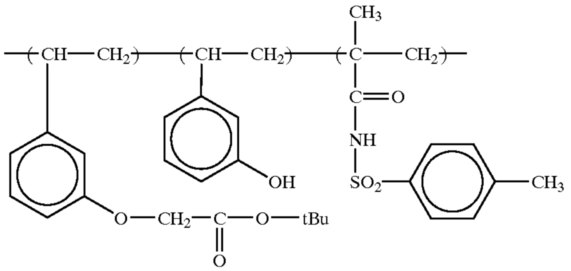
(ix)
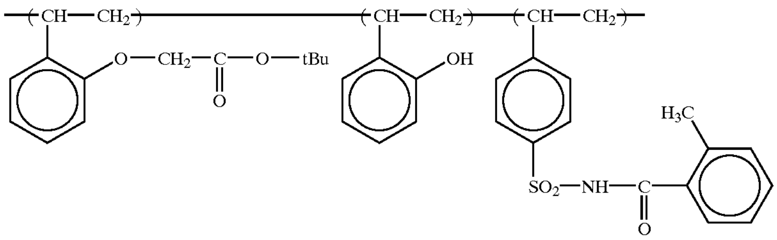
(x)
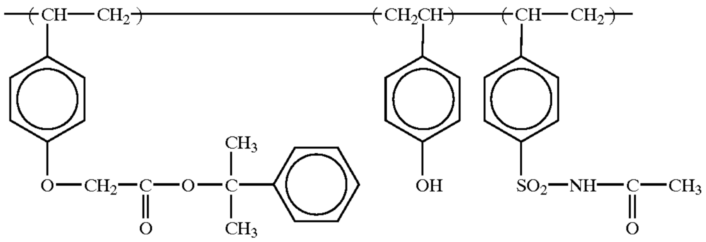
(xi)
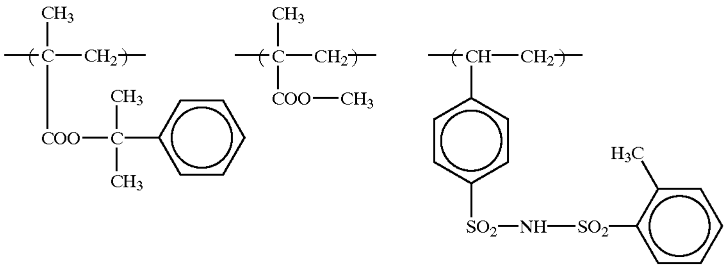
(xii)
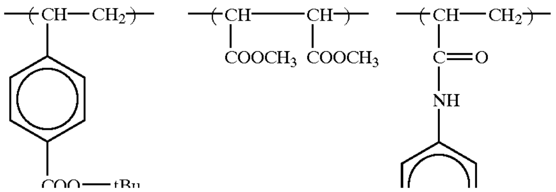

In the case where the exposure light is ArF excimer laser light having a wavelength of 193 nm, the resin is preferably one which contains, in the backbone or side chains thereof, major repeating units each containing not a benzene ring but an alicyclic structure.

The alicyclic structures may be monocyclic or polycyclic. Examples thereof include groups having, for example, a mono-, bi-, tri-, or tetracyclic structure having 5 or more carbon atoms. These cyclic structures have preferably 6 to 30 carbon atoms, more preferably 7 to 25 carbon atoms. These alicyclic hydrocarbon groups may have one or more substituents. Examples of such alicyclic structures include cyclopentane, cyclohexane, cycloheptane, cyclooctane, cyclodecane, cyclododecane, and the following structures.

(1)

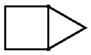

(2)

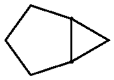

(3)

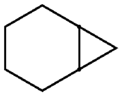

(4)

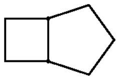

(5)

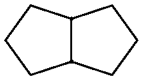

(6)

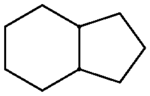

(7)

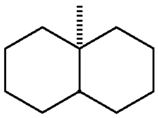

(8)

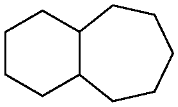

(9)

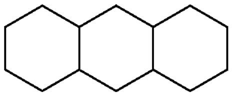

(10)

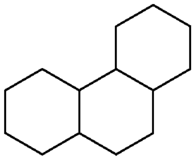

(11)

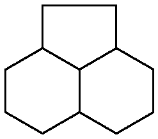

-continued (12)

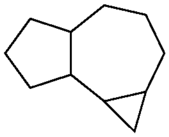

(13)

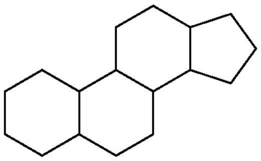

(14)

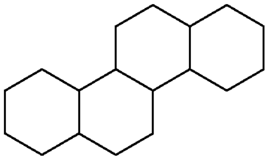

(15)

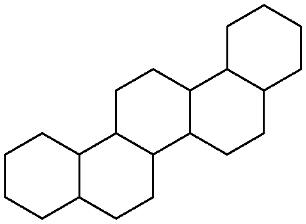

(16)

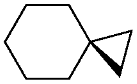

(17)

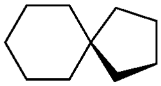

(18)

(19)

(20)

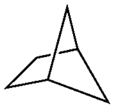

(21)

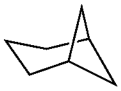

(22)

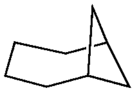

(23)

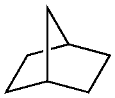

-continued
(24)
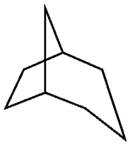
(25)
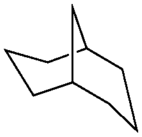
(26)
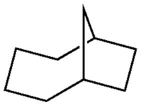
(27)
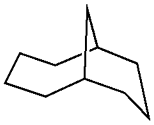
(28)
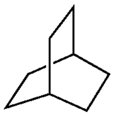
(29)
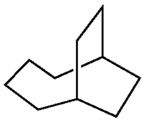
(30)
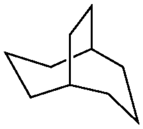
(31)
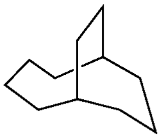
(32)
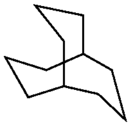
(33)
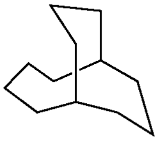
(34)
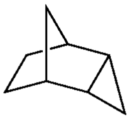
-continued
(35)
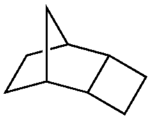
(36)
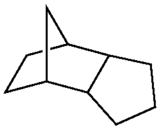
(37)
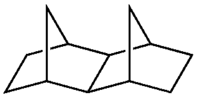
(38)
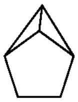
(39)
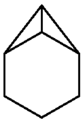
(40)
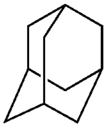
(41)
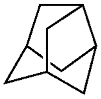
(42)
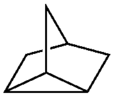
(43)
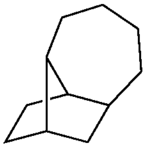
(44)
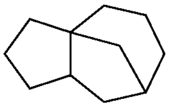
(45)
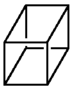
(46)
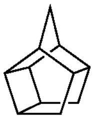

-continued (47)

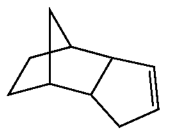

Preferred of these are cyclopentane, cyclohexane, (5), (6), (7), (9), (10), (13), (14), (15), (23), (28), (36), (37), (42), and (47).

Examples of the substituents of these alicyclic structures include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl, and a more preferred alkyl substituent is one selected from the group consisting of methyl, ethyl, propyl, and isopropyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Preferred examples of the above acid-decomposable resin include the following ① to ③.

① resin which contains repeating units represented by general formula (I) and further contains, in side chains thereof, repeating units each containing an alicyclic structure and repeating units each having an acid-decomposable group.

② A resin which contains repeating units represented by general formula (I) and repeating units each having an acid-decomposable group containing an alicyclic structure.

③ A resin which contains repeating units represented by general formula (I) and further contains, in side chains thereof, repeating units each having both an alicyclic structure and an acid-decomposable group.

Resin example ① is preferably a polymer represented by the following general formula (Ia).

(Ia)

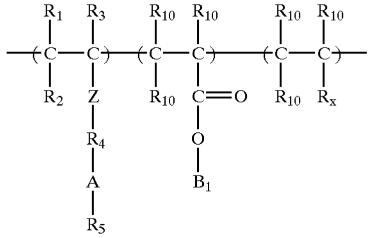

In general formula (Ia), $R_1$ to $R_3$, $R_4$, $R_5$, A, and Z respectively have the same meanings as in general formula (I). $B_1$ represents a univalent alicyclic group. Rx represents an acid-decomposable group. $R_{10}$'s may be the same or different and each represents a hydrogen atom or an optionally substituted, linear or branched alkyl group having 1 to 4 carbon atoms. Examples of the univalent alicyclic group represented by $B_1$ include univalent residues of the alicyclic structures shown above.

Examples of the acid-decomposable group represented by Rx include the aforementioned acid-decomposable groups.

Resin example ② is preferably a polymer represented by the following general formula (Ib).

General Formula (Ib)

(Ib)

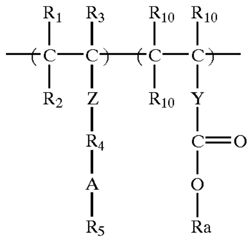

In general formula (Ib), $R_1$ to $R_3$, $R_4$, $R_5$, A, and Z respectively have the same meanings as in general formula (I). $R_{10}$'s may be the same or different and each represents a hydrogen atom or an optionally substituted, linear or branched alkyl group having 1 to 4 carbon atoms. Y represents one member or a combination of two or more members selected from the group consisting of a single bond, an alkylene group, a substituted alkylene group, an ether group, a thioether group, a carbonyl group, and an ester group.

Ra represents at least one group selected from groups represented by the following formulae (RaI) to (RaVI).

(RaI)

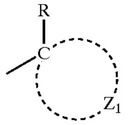

(RaII)

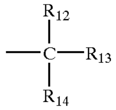

(RaIII)

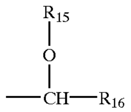

(RaIV)

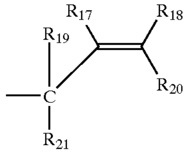

(RaV)

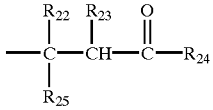

(RaVI)

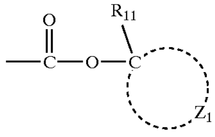

In formulae (RaI) to (RaVI), $R_{11}$ represents methyl, ethyl, n-propyl, isopropyl, n-butyl, isobutyl, or sec-butyl, and $Z_1$ represents a group of atoms necessary for forming an alicyclic group in cooperation with the carbon atom.

$R_{12}$ to $R_{16}$ each independently represents a linear or branched alkyl group having 1 to 4 carbon atoms or an alicyclic group, provided that at least one of $R_{12}$ to $R_{14}$ or either of $R_{15}$ and $R_{16}$ represents an alicyclic group.

$R_{17}$ to $R_{21}$ each independently represents a hydrogen atom, a linear or branched alkyl group having 1 to 4 carbon atoms, or an alicyclic group, provided that at least one of $R_{17}$ to $R_{21}$ represents an alicyclic group and either of $R_{19}$ and $R_{21}$ represents a linear or branched alkyl group having 1 to 4 carbon atoms or an alicyclic group.

$R_{22}$ to $R_{25}$ each independently represents a linear or branched alkyl group having 1 to 4 carbon atoms or an alicyclic group, provided that at least one of $R_{22}$ to $R_{25}$ represents an alicyclic group.

In general formulae (RaI) to (RaVI), the alkyl group represented by $R_{12}$ to $R_{25}$ is a linear or branched alkyl group having 1 to 4 carbon atoms which maybe optionally substituted. Examples of the alkyl group include methyl, ethyl, n-propyl, isopropyl, n-butyl, isobutyl, sec-butyl, and t-butyl.

Examples of the substituent(s) of the above alkyl group include alkoxy groups having 1 to 4 carbon atoms, halogen atoms (fluorine, chlorine, bromine, and iodine atoms), acyl groups, acyloxy groups, cyano, hydroxyl, carboxyl, alkoxycarbonyl groups, and nitro.

The alicyclic group represented by $R_{11}$ to $R_{25}$ and the alicyclic group constituted of Z and the carbon atom each may be monocyclic or polycyclic. Examples thereof include groups having, for example, a mono-, bi-, tri-, or tetracyclic structure having 5 or more carbon atoms. These cyclic structures have preferably 6 to 30 carbon atoms, more preferably 7 to 25 carbon atoms. These alicyclic groups may have one or more substituents.

Preferred examples of the above alicyclic structures in general formulae (RaI) to (RaVI) include adamantyl, noradamantyl, decalin residues, tricyclodecanyl, tetracyclodecanyl, norbornyl, cedorol residues, cyclohexyl, cycloheptyl, cyclooctyl, cyclodecanyl, and cyclododecanyl. More preferred of these are adamantyl, decalin residues, norbornyl, cedorol residues, cyclohexyl, cycloheptyl, cyclooctyl, cyclodecanyl, and cyclododecanyl.

Examples of the substituents of these alicyclic groups include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl, and a more preferred alkyl substituent is one selected from the group consisting of methyl, ethyl, propyl, and isopropyl. Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Besides the acid-decomposable groups represented by —COORa, repeating units each containing another acid-decomposable group are preferably contained in the polymer represented by general formula (Ib). Examples of these repeating units include repeating units containing an acid-decomposable group Rx contained in the polymer represented by general formula (Ia).

Resin example ③ is preferably a polymer represented by the following general formula (Ic).

General Formula (Ic)

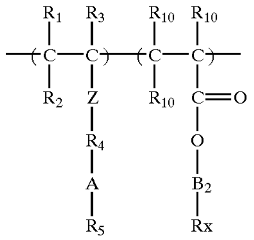

(Ic)

In general formula (Ic), $R_1$ to $R_3$, $R_4$, $R_5$, A, and Z respectively have the same meanings as in general formula (I). $B_2$ represents either a bivalent alkylene group containing an alicyclic group or a bivalent alicyclic group. Rx represents an acid-decomposable group. $R_{10}$'s may be the same or different and each represents a hydrogen atom or an optionally substituted, linear or branched alkyl group having 1 to 4 carbon atoms. The alicyclic group contained in $B_2$ is one having preferably 6 to 30 carbon atoms, more preferably 7 to 25 carbon atoms, and examples thereof include bivalent groups derived from the aforementioned alicyclic structures. The alkylene group constituting a bivalent group in cooperation with the alicyclic group is an optionally substituted, linear or branched alkylene group having 1 to 4 carbon atoms. Examples of the acid-decomposable group represented by Rx include the aforementioned acid-decomposable groups.

The acid-decomposable resin can be used as a copolymer containing repeating units derived from any of various monomers, besides the repeating units described above, for the purpose of regulating not only dry-etching resistance, developability with standard developing solutions, adhesion to substrates, and resist profile but also properties generally required of resists, such as resolution, heat resistance, and sensitivity.

Examples of such repeating units include those derived from the following monomers, but usable monomers should not be construed as being limited thereto.

The incorporation of such repeating units makes it possible to finely regulate, in particular, (1) solubility in solvents, (2) film-forming properties (glass transition point), (3) alkali developability, (4) film thickness reduction (hydrophilicity/hydrophobicity; selection of alkali-soluble groups), (5) adhesion in unexposed areas to substrates, and (6) dry-etching resistance.

Examples of such comonomers include compounds having one addition-polymerizable unsaturated bond which are selected from acrylic esters, methacrylic esters, acrylamide and analogues thereof, methacrylamide and analogues thereof, allyl compounds, vinyl ethers, vinyl esters, and the like.

Specific examples thereof include: acrylic esters such as alkyl acrylates wherein the alkyl group preferably has 1 to 10 carbon atoms (e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate);

methacrylic esters such as alkyl methacrylates wherein the alkyl group preferably has 1 to 10 carbon atoms (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate);

acrylamide and analogues thereof such as N-alkylacrylamides (examples of the alkyl group include those having 1 to 10 carbon atoms, such as methyl, ethyl, propyl, butyl, t-butyl, heptyl, octyl, cyclohexyl, and hydroxyethyl), N,N-dialkylacrylamides (examples of each alkyl group include those having 1 to 10 carbon atoms, such as methyl, ethyl, butyl, isobutyl, ethylhexyl, and cyclohexyl), N-hydroxyethyl-N-methylacrylamide, and N-2-acetamidoethyl-N-acetylacrylamide;

methacrylamide and analogues thereof such as N-alkylmethacrylamides (examples of the alkyl group include those having 1 to 10 carbon atoms, such as methyl, ethyl, t-butyl, ethylhexyl, hydroxyethyl, and cyclohexyl), N,N-dialkylmethacrylamides (examples of each alkyl group include ethyl, propyl, and butyl), and N-hydroxyethyl-N-methylmethacrylamide;

allyl compounds such as allyl esters (e.g., allyl acetate, allyl caproate, allyl caprylate, allyl laurate, allyl palmitate, allyl stearate, allyl benzoate, allyl acetoacetate, and allyl lactate) and allyloxyethanol;

vinyl ethers such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether);

vinyl esters such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl P-phenylbutyrate, and vinyl cyclohexylcarboxylate;

dialkyl itaconates (e.g., dimethyl itaconate, diethyl itaconate, and dibutyl itaconate); dialkyl fumarates (e.g., dibutyl fumarate) and monoalkyl fumarates; and acrylic acid, methacrylic acid, crotonic acid, itaconic acid, maleic anhydride, maleimide, acrylonitrile, methacrylonitrile, maleonitrile, and the like.

Besides the compounds enumerated above, other addition-polymerizable unsaturated compounds may be used as long as they are copolymerizable with the various repeating units described above.

In the acid-decomposable resin, the molar proportion of repeating units of each kind is suitably determined so as to regulate not only the dry-etching resistance of the resist, developability thereof with standard developing solutions, adhesion thereof to substrates, and resist profile but also properties generally required of resists, such as resolution, heat resistance, and sensitivity.

The content of repeating units represented by general formula (I) in the acid-decomposable resin is preferably from 0.01 to 30 mol %, more preferably from 0.1 to 25 mol %, most preferably from 0.5 to 20 mol %, based on all repeating monomer units.

The content of repeating units each containing an acid-decomposable group in the acid-decomposable resin is preferably from 3 to 65 mol %, more preferably from 5 to 60 mol %, most preferably from 7 to 55 mol %, based on all repeating monomer units.

In the case where the resin is for use in ArF exposure, the content of repeating units each containing an alicyclic structure in the acid-decomposable resin is preferably from 30 to 99 mol %, more preferably from 32 to 97 mol %, most preferably from 35 to 95 mol %, based on all repeating monomer units.

Carboxyl, hydroxyl, cyano, or lactone groups or the like can be incorporated into the acid-decomposable resin for ArF exposure according to the present invention for the purpose of imparting adhesiveness.

The acid-decomposable resin has an acid value of preferably 1.5 meq/g or lower, more preferably 1.2 meq/g or lower, most preferably 1.0 meq/g or lower.

The content of repeating units derived from the aforementioned optional comonomers in the resin also can be suitably determined according to the desired resist performances. In general, however, the content of these optional repeating units is preferably 99 mol % or lower, more preferably 90 mol % or lower, most preferably 80 mol % or lower, based on all essential repeating units.

The molecular weight of the acid-decomposable resin described above is preferably from 1,000 to 1,000,000, more preferably from 1,500 to 500,000, even more preferably from 2,000 to 200,000, most preferably from 2,500 to 100,000, in terms of weight-average molecular weight ($M_w$; calculated for standard polystyrene). The higher the molecular weight of the resin, the more the heat resistance and other properties improve but the more the developability and other properties decrease. The molecular weight of the resin is regulated to a value in the preferred range so as to balance these properties.

The acid-decomposable resin for use in the present invention can be synthesized by an ordinary method (e.g., radical polymerization).

In the positive resist fluid of the present invention, the content of the acid-decomposable resin is preferably from 40 to 99.99 wt %, more preferably from 50 to 99.97 wt %, based on all solid components in the resist fluid.

(ii) Resin decomposing by the action of acid to have enhanced solubility in alkali:

The resin (ii) which decomposes by the action of an acid to have enhanced solubility in an alkali (hereinafter often referred to simply as "alkali-soluble resin (ii)") for use in the positive resist composition of the present invention contains alkali-soluble groups protected by groups containing an alicyclic hydrocarbon structure and represented by at least one of general formulae (pI) to (pVI) described above and further contains groups represented by general formula (qI) described above.

In general formulae (pI) to (pVI), the alkyl group represented by $R_{12}$ to $R_{25}$ is an optionally substituted, linear or branched alkyl group having 1 to 4 carbon atoms. Examples of the alkyl group include methyl, ethyl, n-propyl, isopropyl, n-butyl, isobutyl, sec-butyl, and t-butyl.

Examples of the substituent(s) of the above alkyl group include alkoxy groups having 1 to 4 carbon atoms, halogen atoms (fluorine, chlorine, bromine, and iodine atoms), acyl groups, acyloxy groups, cyano, hydroxyl, carboxy, alkoxycarbonyl groups, and nitro.

The alicyclic hydrocarbon group represented by $R_{11}$ to $R_{25}$ and the alicyclic hydrocarbon group constituted of Z and the carbon atom each may be monocyclic or polycyclic. Examples thereof include groups having, for example, a mono-, bi-, tri-, or tetracyclic structure having5 or more carbon atoms. These cyclic structures have preferably 6 to 30 carbon atoms, more preferably 7 to 25 carbon atoms. These alicyclic hydrocarbon groups may have one or more substituents.

Examples of the alicyclic structure contained in or constituting the alicyclic hydrocarbon group are shown below.

(1)

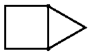

(2)

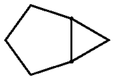

(3)

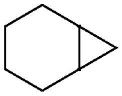

(4)

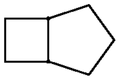

(5)

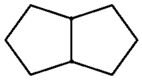

(6)

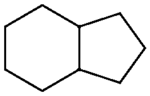

(7)

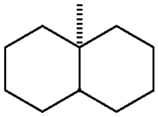

(8)

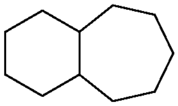

(9)

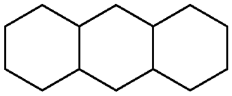

(10)

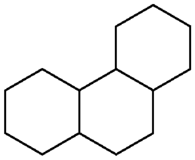

(11)

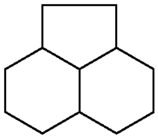

-continued (12)

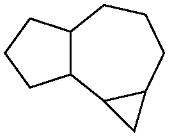

(13)

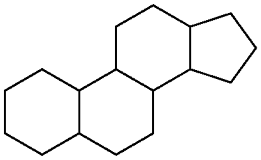

(14)

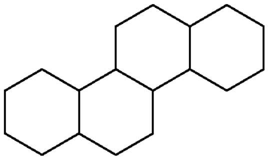

(15)

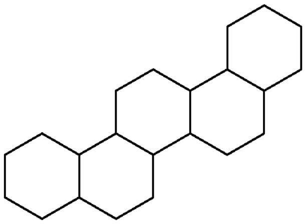

(16)

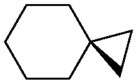

(17)

(18)

(19)

(20)

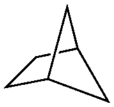

(21)

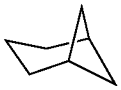

(22)

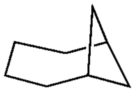

(23)

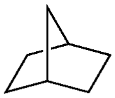

-continued
(24)
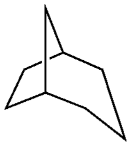
(25)
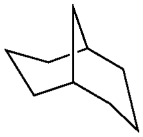
(26)
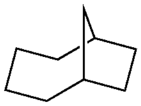
(27)
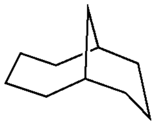
(28)
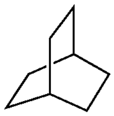
(29)
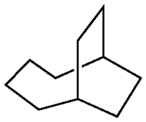
(30)
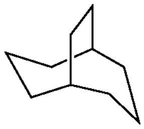
(31)
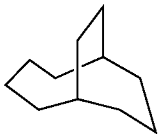
(32)
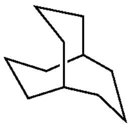
(33)
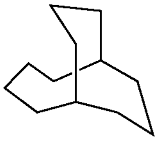
(34)
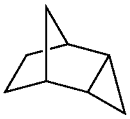
-continued
(35)
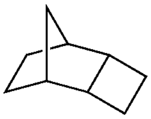
(36)
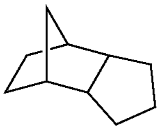
(37)
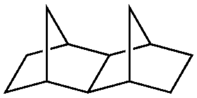
(38)
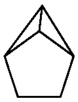
(39)
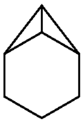
(40)
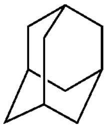
(41)
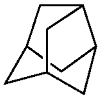
(42)
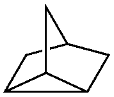
(43)
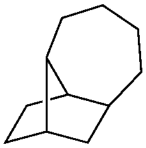
(44)
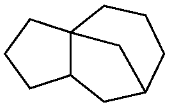
(45)
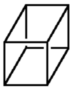
(46)
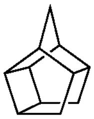
(47)

-continued (48)

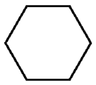

(49)

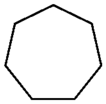

(50)

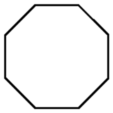

Preferred examples of the alicyclic structure include adamantyl, noradamantyl, decalin residues, tricyclodecanyl, tetracyclodecanyl, norbornyl, cedorol residues, cyclohexyl, cycloheptyl, cyclooctyl, cyclodecanyl, and cyclododecanyl. More preferred of these are adamantyl, decalin residues, norbornyl, cedorol residues, cyclohexyl, cycloheptyl, cyclooctyl, cyclodecanyl, and cyclododecanyl.

Examples of the substituents of these alicyclic hydrocarbon groups include alkyl groups, substituted alkyl groups, halogen atoms, hydroxyl, alkoxy groups, carboxyl, and alkoxycarbonyl groups. Preferred examples of the alkyl groups include lower alkyl groups such as methyl, ethyl, propyl, isopropyl, and butyl. More preferred of these are methyl, ethyl, propyl, and isopropyl.

Examples of the substituents of the substituted alkyl groups include hydroxyl, halogen atoms, and alkoxy groups. Examples of the alkoxy groups include those having 1 to 4 carbon atoms, such as methoxy, ethoxy, propoxy, and butoxy.

Examples of the alkali-soluble groups each protected by a structure represented by any of general formulae (pI) to (pVI) in the alkali-soluble resin (ii) include various groups known in this technical field. Specific examples thereof include carboxy, sulfo, phenol, and thiol groups. Preferred of these are carboxy and sulfo.

Preferred examples of the alkali-soluble groups each protected by a structure represented by any of general formulae (pI) to (pVI) in the above resin include groups represented by the following general formulae (pVII) to (pXI).

(pVII)

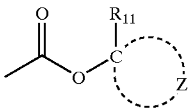

(pVIII)

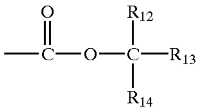

(pIX)

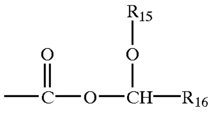

-continued (pX)

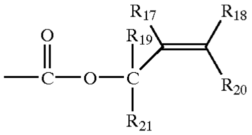

(pXI)

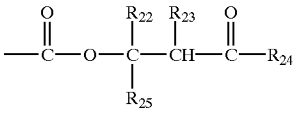

In general formulae (pVII) to (pXI), $R_{11}$ to $R_{25}$ and Z respectively have the same meanings as defined above.

Although the alkali-soluble resin (ii) has alkali-soluble groups each protected by a structure represented by any of general formulae (pI) to (pVI), it preferably contains repeating structural units represented by. the following general formula (pA).

(pA)

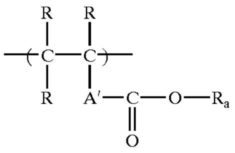

In formula (pA), R's may be the same or different and each represents a hydrogen atom, a halogen atom, or an optionally substituted, linear or branched alkyl group having 1 to 4 carbon atoms. Like the A described above, A' represents one member or a combination of two or more members selected from the group consisting of a single bond, an alkylene group, a substituted alkylene group, an ether group, a thioether group, a carbonyl group, and an ester group. $R_a$ represents a group represented by any of general formulae (pI) to (pVI).

Specific examples of monomers corresponding to the repeating units represented by general formula (pA) are shown below.

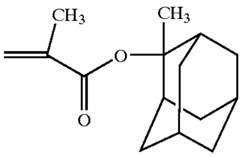

1

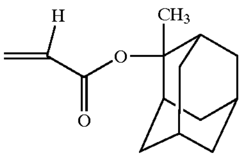

2

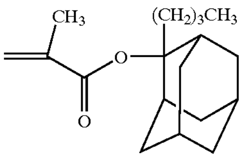

3

-continued
4
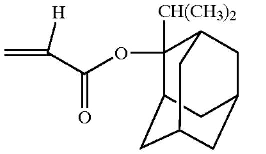
5
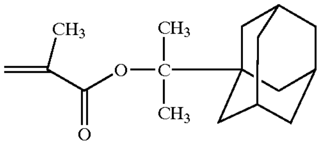
6
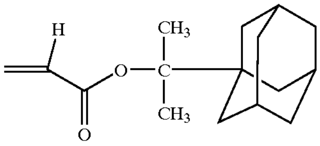
7
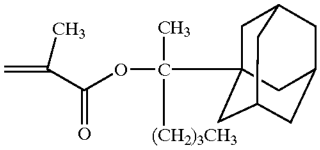
8
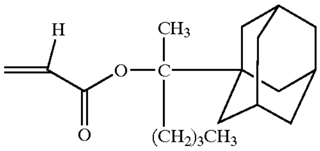
9
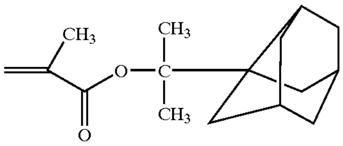
10
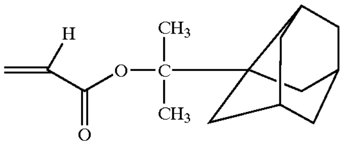
11
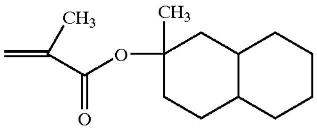
12
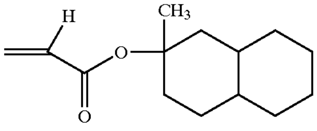
13
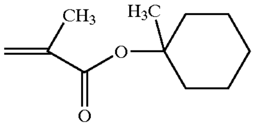
-continued
14
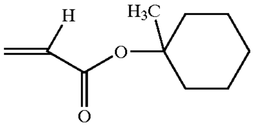
15
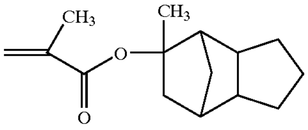
16
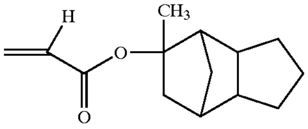
17
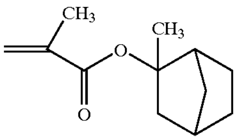
18
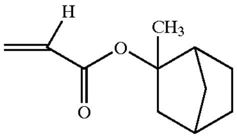
19
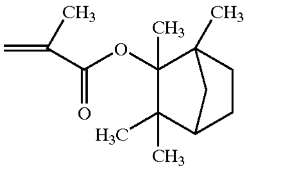
20
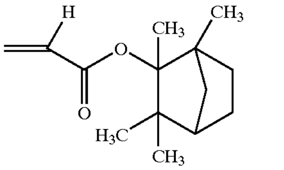
21
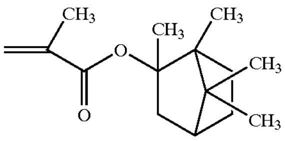
22
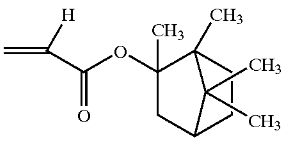
23
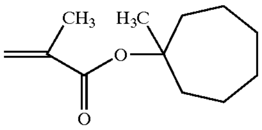

-continued
24
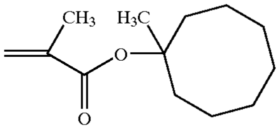
25
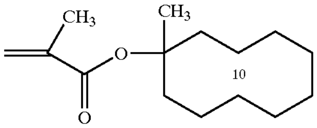
26
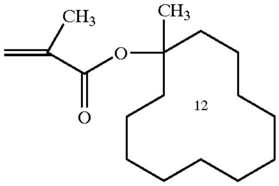
27
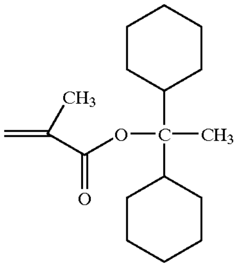
28
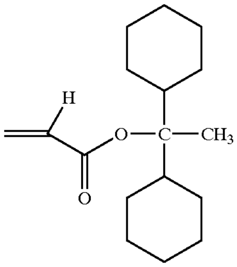
29
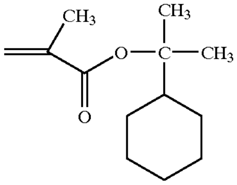
30
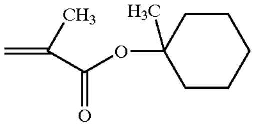
31
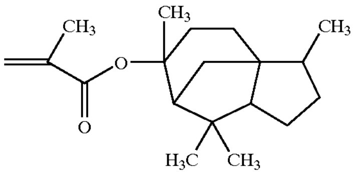
-continued
32
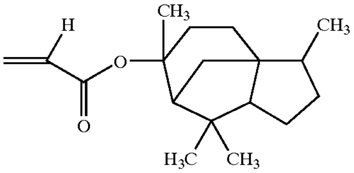
33
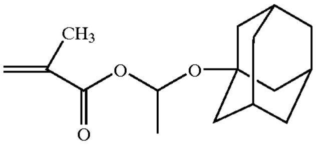
34
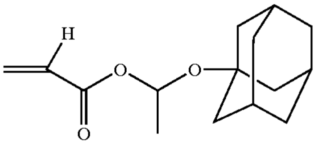
35
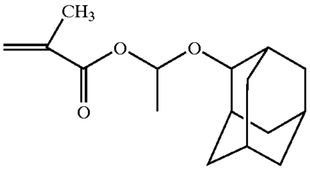
36
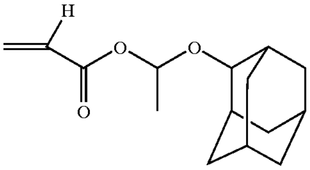
37
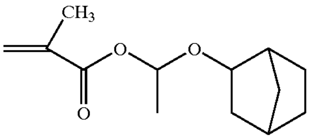
38
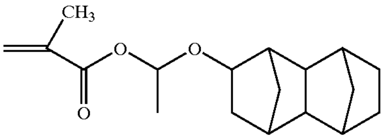
39
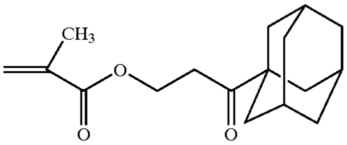
40
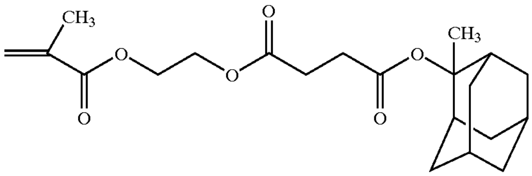

-continued

41

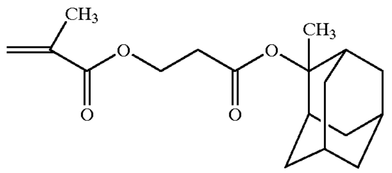

The alkali-soluble resin (ii) contains groups represented by general formula (qI) described above: —A—X—$R_5$.

The alkylene group represented by A in general formula (qI) is preferably a linear or branched alkylene group having 1 to 6 carbon atoms. Examples thereof include methylene, ethylene, propylene, and butylene. The alkylene group maybe substituted, and examples of the substituent(s) include halogen atoms, alkoxy groups, hydroxyl, and cyano.

The alkyl group represented by $R_5$ in general formula (qI) is preferably a linear or branched alkyl group having 1 to 20 carbon atoms. Examples thereof include methyl, ethyl, n-propyl, isopropyl, n-butyl, isobutyl, sec-butyl, t-butyl, pentyl, hexyl, heptyl, octyl, nonyl, decanyl, dodecanyl, and tetradecanyl. The alkyl group may be substituted, and examples of the substituent (s) include alkoxy groups having 1 to 4 carbon atoms, halogen atoms (fluorine, chlorine, bromine, and iodine atoms), acyl groups, acyloxy groups, cyano, hydroxyl, carboxyl, alkoxycarbonyl groups, nitro, amino, cyclic ether groups, and carbonyl.

The alicyclic hydrocarbon group represented by $R_5$ in general formula (qI) may be monocyclic or polycyclic. Examples thereof include groups having, for example, a mono-, bi-, tri-, or tetracyclic structure having 5 or more carbon atoms. These cyclic structures have preferably 6 to 30 carbon atoms, more preferably 7 to 25 carbon atoms. These alicyclic hydrocarbon groups may have one or more substituents, examples of which are the same as those enumerated with regard to the above alkyl group.

Examples of the alicyclic structure contained in or constituting the alicyclic hydrocarbon group include the structures shown hereinabove with regard to $R_{11}$ to $R_{25}$ in general formulae (pI) to (pVI).

Although the alkali-soluble resin (ii) has groups represented by general formula (qI) described above, it preferably has repeating structural units represented by the following general formula (qA):

(qA)

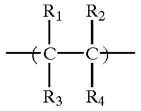

(wherein $R_1$ to $R_4$ each represents a hydrogen atom, a cyano group, a halogen atom, or an optionally substituted, linear or branched alkyl group having 1 to 4 carbon atoms, provided that at least one of $R_1$ to $R_4$ represents a group shown by —A—X—$R_5$described above).

Specific examples of monomers giving the repeating units each having a group represented by general formula (qI) are shown below.

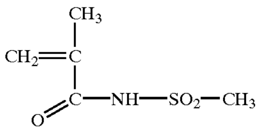

(q1)

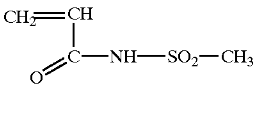

(q2)

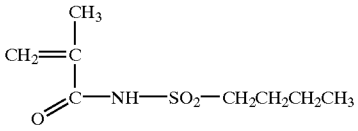

(q3)

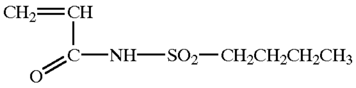

(q4)

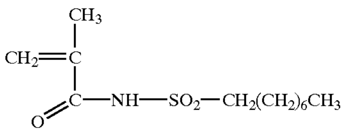

(q5)

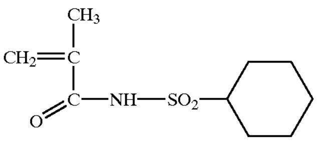

(q6)

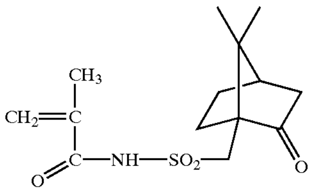

(q7)

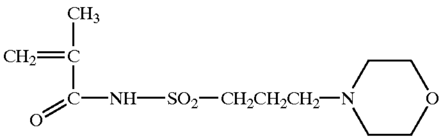

(q8)

-continued
(q9)
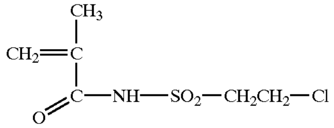
(q10)
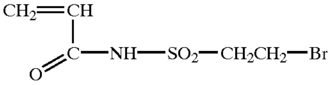
(q11)
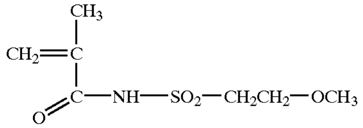
(q12)
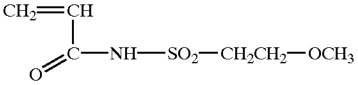
(q13)
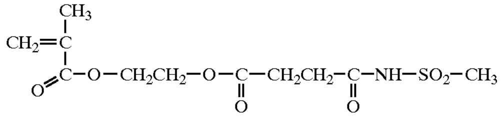
(q14)
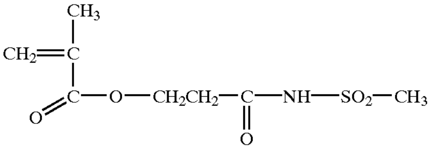
(q15)
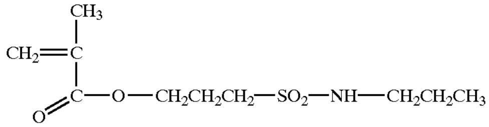
(q16)
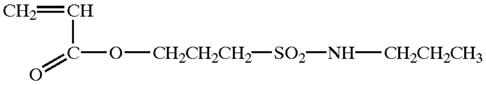
(q17)
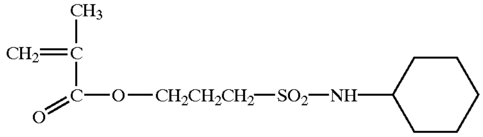
(q18)
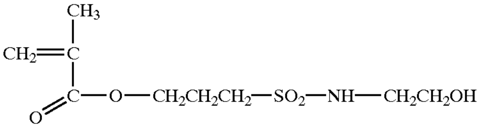
(q19)
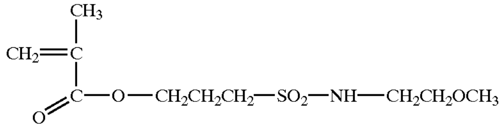
(q20)
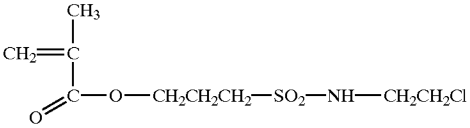
(q21)
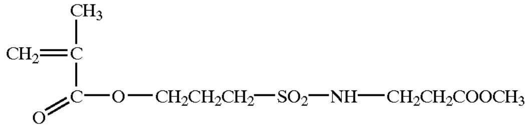
(q22)
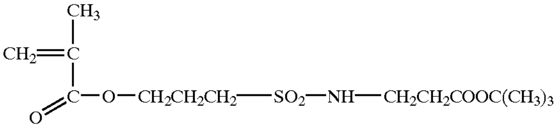
(q23)
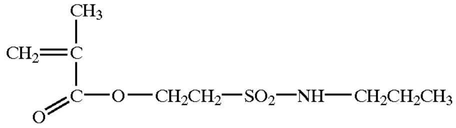
(q24)
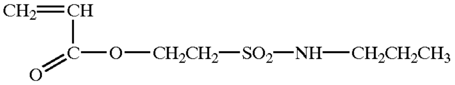
(q25)
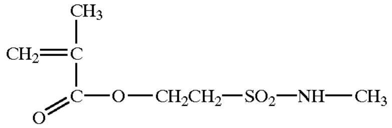
(q26)
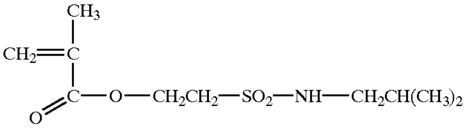
(q27)
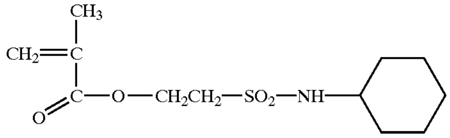
(q28)
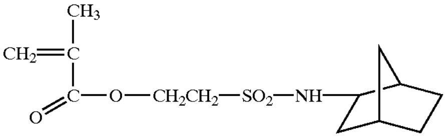
(q29)
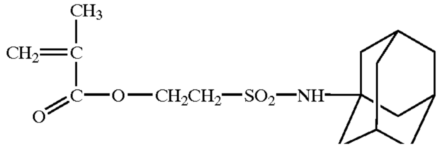
(q30)
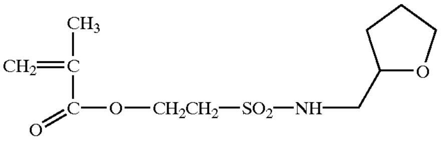

The alkali-soluble resin (ii) preferably contains groups represented by the following general formula (A) which decompose by the action of an acid.

General Formula (A):

$$—C(=O)—O—R_0$$

In formula (A), $R_0$ represents a tertiary alkyl, 1-alkoxyethyl, alkoxymethyl, tetrahydropyranyl, tetrahydrofuranyl, trialkylsilyl, 3-oxocyclohexyl, or lactone group.

Other repeating units may be contained in the alkali-soluble resin (ii), besides the repeating units each having an alkali-soluble group protected by a structure represented by any of general formulae (pI) to (pVI) and the repeating units each having a group represented by general formula (qI).

Such optional repeating units are preferably represented by the following general formula (AI).

(AI)

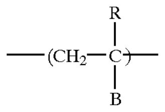

In general formula (AI), R has the same meaning as in general formula (pA) described above, and B represents a halogen atom, a cyano group, a group which decomposes by the action of an acid, $—C(=O)—Y—A—R_{C9}$, or $—COOR_{C11}$, wherein Y represents an oxygen atom or a sulfur atom;

$R_{C9}$ represents —COOH, $—COOR_{C10}$ (wherein $R_{C10}$ has the same meaning as $R_{C11}$ or represents any of the lactone structures shown below) —CN, a hydroxyl group, an optionally substituted alkoxy group, $—CO—NH—R_{C11}$, or any of the following lactone structures;

$R_{C11}$ represents an optionally substituted alkyl group or an optionally substituted cyclic hydrocarbon group; and A represents one member or a combination of two or more members selected from the group consisting of a single bond, an alkylene group, a substituted alkylene group, an ether group, a thioether group, a carbonyl group, and an ester group.

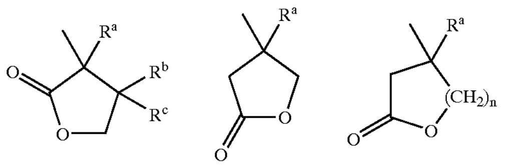

In the above lactone structures, $R^a$, $R^b$, and $R^c$ each represents a hydrogen atom or an optionally substituted, linear or branched alkyl group having 1 to 4 carbon atoms, and n is an integer of 2 to 4.

In general formula (AI), the group represented by B which decomposes by the action of an acid is preferably a group represented by $—C(=O)—X_1—R_0$. Examples of $R_0$ include tertiary alkyl groups such as t-butyl and t-amyl, isobornyl, 1-alkoxyethyl groups such as 1-ethoxyethyl, 1-butoxyethyl, 1-isobutoxyethyl, and 1-cyclohexyloxyethyl, alkoxymethyl groups such as 1-methoxymethyl and 1-ethoxymethyl, tetrahydropyranyl, tetrahydrofuranyl, trialkylsilyl groups, and 3-oxocyclohexyl. $X_1$ represents an oxygen atom, a sulfur atom, or —NH—, but is preferably an oxygen atom.

The alkyl group represented by $R_{C11}$ is preferably a linear or branched alkyl group having 1 to 10 carbon atoms, more preferably a linear or branched alkyl group having 1 to 6 carbon atoms. Most preferred examples thereof are methyl, ethyl, propyl, isopropyl, n-butyl, isobutyl, sec-butyl, and t-butyl.

Examples of the cyclic hydrocarbon group represented by $R_{C11}$ include cycloalkyl groups and crosslinked hydrocarbons. Specific examples thereof include cyclopropyl, cyclopentyl, cyclohexyl, adamantyl, bornyl, isobornyl, tricyclodecanyl, dicyclopentenyl, norbornane-epoxy, menthyl, isomenthyl, neomenthyl, and tetracyclododecanyl.

Examples of the alkoxy group represented by $R_{C9}$ include those having 1 to 4 carbon atoms, such as methoxy, ethoxy, propoxy, and butoxy.

Examples of the substituents of the above alkyl, cycloalkyl, and alkoxy groups include hydroxyl, halogen atoms, carboxyl, alkoxy groups, acyl groups, cyano, and acyloxy groups. Examples of the alkoxy groups include those having 1 to 4 carbon atoms, such as methoxy, ethoxy, propoxy, and butoxy. Examples of the acyl groups include formyl and acetyl. Examples of the acyloxy groups include acetoxy.

In general formulae (AI) and (pA), examples of the alkylene group and substituted alkylene group represented by A' include groups shown by the following formula.

$$—[C(Ra)(Rb)]_r—$$

In the above formula, Ra and Rb maybe the same or different and each represents a hydrogen atom, an alkyl group, a substituted alkyl group, a halogen atom, hydroxyl, or an alkoxy group. The alkyl group is preferably a lower alkyl group such as, e.g., methyl, ethyl, propyl, isopropyl, or butyl, and is more preferably a substituent selected from the group consisting of methyl, ethyl, propyl, and isopropyl. Examples of the substituent(s) of the substituted alkyl group include hydroxyl, halogen atoms, and alkoxy groups. Examples of the alkoxy groups include those having 1 to 4 carbon atoms, such as methoxy, ethoxy, propoxy, and butoxy.

In the above formula, r represents an integer of 1 to 10.

Examples of the halogen atom include chlorine, bromine, fluorine, and iodine atoms.

Preferred examples of B are acid-decomposable groups and mevalonolactone groups.

In the alkali-soluble resin (ii) according to the present invention, the optional comonomer units such as those represented by general formula (AI) preferably contain an acid-decomposable group other than the alkali-soluble groups each protected by a structure represented by any of general formulae (pI) to (pVI) Such acid-decomposable groups which can be contained in the resin are preferably groups represented by $—C(=O)—O—R_0$ described above.

The alkali-soluble resin (ii) can be used as a copolymer containing repeating units derived from any of various monomers, besides the repeating units described above, for the purpose of regulating not only dry-etching resistance, developability with standard developing solutions, adhesion to substrates, and resist profile but also properties generally required of resists, such as resolution, heat resistance, and sensitivity.

Examples of such repeating units are the same as the aforementioned repeating units which may be contained in the resin containing repeating units represented by general formula (I).

In the alkali-soluble resin (ii), the molar proportion of repeating units of each kind is suitably determined so as to regulate not only the dry-etching resistance of the resist, developability thereof with standard developing solutions, adhesion to substrates, and resist profile but also properties generally required of resists, such as resolution, heat resistance, and sensitivity.

The content of repeating units each having an alkali-soluble group protected by a structure represented by any of general formulae (pI) to (pVI) in the alkali-soluble resin (ii) is generally from 30 to 70 mol %, preferably from 35 to 65 mol %, more preferably from 40 to 60 mol %, based on all repeating units.

The content of repeating units each containing a group represented by general formula (qI) is generally from 0.01 to 30 mol %, preferably from 0.1 to 25 mol %, more preferably from 0.5 to 20 mol %, based on all repeating units.

Furthermore, the content of repeating units each containing an acid-decomposable group, other than the repeating units each having an alkali-soluble group protected by a structure represented by any of general formulae (pI) to (pVI) and the repeating units each having a group represented by general formula (qI), in the alkali-soluble resin (ii) is generally 65 mol % or lower, preferably from 3 to 60 mol %, more preferably from 5 to 55 mol %, based on all repeating monomer units.

The alkali-soluble resin (ii) has an acid value of generally 1.5 or lower, preferably 1.2 or lower, more preferably 1.0 or lower, in terms of the amount of acid groups per gram of the resin, expressed in meq/g. It is preferred to regulate the content of repeating structural units of each kind so as to result in an acid value within that range This acid value correlates with the content of acid groups, such as carboxyl groups, which impart adhesiveness.

Acid value is determined by dissolving about 1 g of the resin in a tetrahydrofuran/ion-exchanged water (54 mL/6 mL) mixed solvent and titrating the solution with an aqueous sodium hydroxide solution.

The content of repeating units derived from the aforementioned optional comonomers in the resin also can be suitably determined according to the desired resist performances. In general, however, the content of these optional repeating units is preferably 99 mol % or lower, more preferably 90 mol % or lower, most preferably 80 mol % or lower, based on the total amount of the repeating units each containing an alkali-soluble group protected by a group containing an alicyclic hydrocarbon structure and represented by any of general formulae (pI) to (pVI) and the repeating units each containing a group represented by general formula (qI):

$$—A—X—R_5.$$

The weight-average molecular weight $M_w$ of the alkali-soluble resin (ii), as measured by gel permeation chromatography and calculated for standard polystyrene, is preferably from 1,000 to 1,000,000, more preferably from 1,500 to 500,000, even more preferably from 2,000 to 200,000, most preferably from 2,500 to 100,000. The higher the weight-average molecular weight of the resin, the more the heat resistance and other properties improve but the more the developability and other properties decrease. The molecular weight of the resin is regulated to a value in the preferred range so as to balance these properties.

The alkali-soluble resin (ii) for use in the present invention can be synthesized by an ordinary method, e.g., radical polymerization.

In the positive photoresist composition of the present invention, the content of the acid-decomposable resin is preferably from 40 to 99.99 wt %, more preferably from 50 to 99.97 wt %, based on all solid components in the resist composition.

[2] Compound which generates an acid upon irradiation with an actinic ray or radiation (Photo-acid Generator)

The photo-acid generator to be used in the present invention is a compound which generates an acid upon irradiation with an actinic ray or radiation.

The compound which decomposes on irradiation of an active ray or radiation to generate an acid for use in the present invention may be appropriately selected from photoinitiators for photo-cation polymerization, photoinitiators for photo-radical polymerization, photo-achromatizing agents, photo-discoloring agents, known compounds used in a microresist or the like, which generate an acid by light (ultraviolet ray or far ultraviolet ray of from 200 to 400 nm, particularly preferably, g-line, h-line, i-line, KrF excimer laser beam), an ArF excimer laser beam, an electron beam, an X ray, a molecular beam or an ion beam, and a mixture of these compounds.

Other examples of the compound generating an acid on irradiation of an actinic ray or radiation for use in the present invention include diazonium salts described in S. I. Schlesinger, *Photogr, Sci, Eng.*, 18, 387 (1974) and T. S. Bal et al., *Polymer*, 21, 423(1980), ammonium salts described in U.S. Pat. Nos. 4,069,055, 4,069,056 and Re 27,992 and JP-A-3-140140, phosphonium salts described in D. C. Necker et al., *Macromolecules*, 17, 2468 (1984), C. S. Wen et al., *Teh, Proc. Conf. Rad. Curing ASIA*, p. 478, Tokyo, October (1988) and U.S. Pat. Nos. 4,069,055 and 4,069,056, iodonium salts described in J. V. Crivello et al., *Macromolecules*, 10(6), 1307 (1977), *Chem. & Eng. News, Nov.* 28, p. 31 (1988), European Patent 104143, 339049 and 410201, JP-A-2-150848 and JP-A-2-296514, sulfonium salts described in J. V. Crivello et al., *Polymer J.* 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci., Polymer Chem. Ed.*, 17, 2877 (1979), European Patents 370693, 161811, 410201, 339049, 233567, 297443 and 297442, U.S. Pat. Nos. 3,902,114, 4,933,377, 4,760,013, 4,734,444 and 2,833, 827, German Patents 2,904,626, 3,604,580 and 3,604,581, JP-A-7-28237 and JP-A-8-27102, selenonium salts described in J. V. Crivello et al., *Macromolecules*, 10(6), 1307 (1977), and J. V. Crivello et al., *J. Polymer Sci., Polymer Chem. Ed.*, 17, 1047 (1979), onium salts such as arsonium salt described in C. S. Wen et al., *Teh, Proc. Conf. Rad. Curing ASIA*, p. 478, Tokyo, October (1988), organic halogen compounds described in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339, organic metals/organic halides described in K. Meier et al., *J. Rad. Curing*, 13(4), 26 (1986), T. P. Gill et al., *Inorg. Chem.*, 19, 3007 (1980), D. Astruc, *Acc. Chem. Res.*, 19(12), 377 (1896) and JP-A-2-161445, photo-acid generators having an o-nitrobenzyl type protective group, described in S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24)2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), H. M. Houlihan et al., *Macromolecules*, 21, 2001 (1988), P. M. Collins et al., *J. Chem. Soc., Chem. Commun.*, 532 (1972), S. Hayase et al., *Macromolecules*, 18, 1799 (1985), E. Reichmanis et al., *J. Electrochem. Soc., Solid State Sci. Technol.*, 130(6), F. M. Houlihan et al., *Macromolecules*, 21, 2001 (1988), European Patents 290750, 046083, 156535, 271851 and 388343, U.S. Pat. Nos. 3,901,710 and 4,181,531, JP-A-60-198538 and JP-A-53-133022, compounds which photolyze and generate a sulfonic acid, represented by iminosulfonate and the like and described in M. Tunooka et al., *Polymer Preprints Japan*, 35(8), G. Berner et al., *J. Rad. Curing*, 13(4), W. J. Mijs et al., *Coating Technol.*, 55(697), 45 (1983) Akzo, H. Adachi et al., *Polymer Preprints, Japan*, 37(3), European Patents 199672, 084515, 044115, 618564 and 101122, U.S. Pat. Nos. 4,371,605 and 4,431,774, JP-A-64-18143, JP-A-2-245756 and JP-A-3-140109, disulfone compounds described in JP-A-61-166544 and JP-A-2-71270, and diazoketosulfone and diazodisulfone compounds described in JP-A-3-103854, JP-A-3-103856 and JP-A-4-210960.

Furthermore, polymer compounds having the group or compound generating an acid by light introduced into the main or side chain thereof may also be used and examples thereof include compounds described in M. E. Woodhouse et al., *J. Am. Chem. Soc.*, 104, 55B6 (1982), S. P. Pappas et al., *J. Imaging Sci.*, 30(5), 218 (1986), S. Kondo et al., *Makromol. Chem., Rapid Commun.*, 9, 625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Also, compounds which generate an acid by light described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126712 may be used.

Among the above-described compounds which decompose on irradiation of an actinic ray or radiation and generate an acid, those which can be particularly effectively used are described below.

(1) Oxazole derivative represented by formula (PAG1) shown below or s-triazine derivative represented by formula (PAG2) shown below, substituted with trihalomethyl group:

(PAG1)

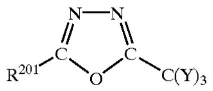

(PAG2)

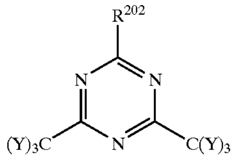

wherein $R^{201}$ represents a substituted or unsubstituted aryl group or an alkenyl group, $R^{202}$ represents a substituted or unsubstituted aryl group, alkenyl group or alkyl group, or $—C(Y)_3$, and Y represents a chlorine atom or a bromine atom.

Specific examples thereof include the following compounds, however, the present invention should not be construed as being limited thereto.

(PAG1-1)

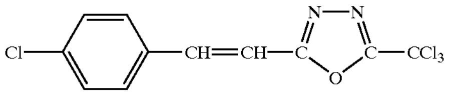

(PAG1-2)

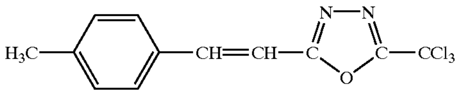

(PAG1-3)

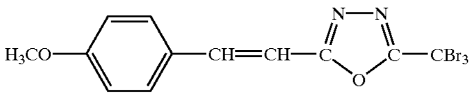

(PAG1-4)

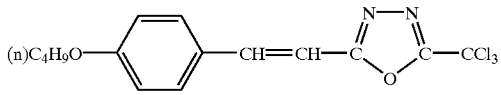

(PAG1-5)

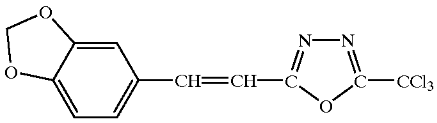

(PAG1-6)

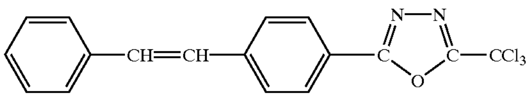

(PAG1-7)

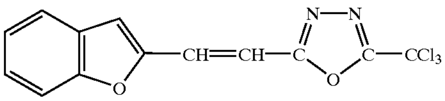

(PAG1-8)

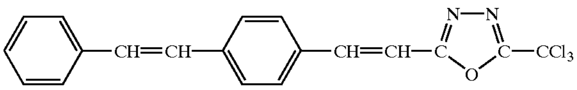

(PAG2-1)

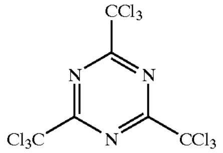

(PAG2-2)

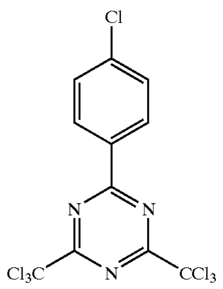

-continued
(PAG2-3)
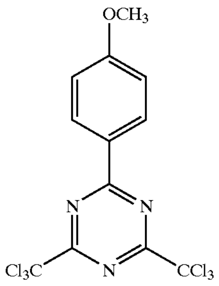
(PAG2-4)
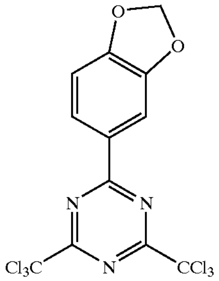
(PAG2-5)
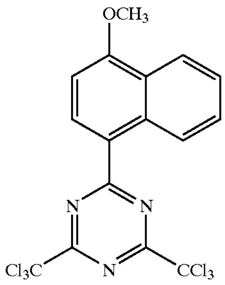
(PAG2-6)
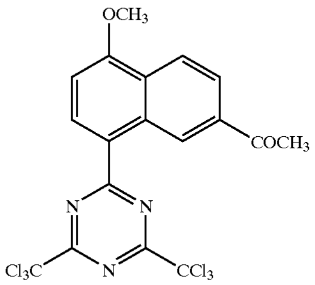
(PAG2-7)
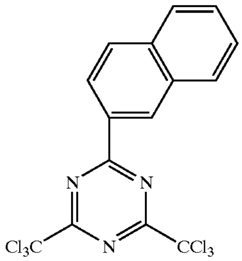
-continued
(PAG2-8)
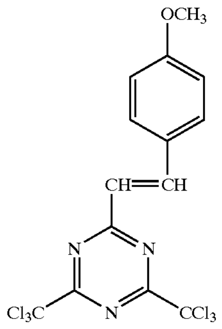
(PAG2-9)
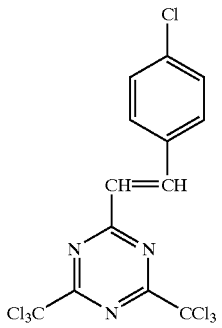
(PAG2-10)
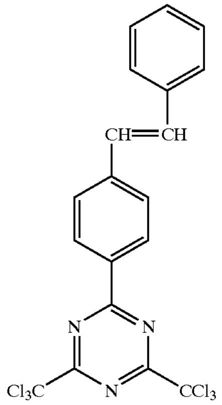
(2) Iodonium salt represented by formula (PAG3) shown below or sulfonium salt represented by formula (PAG4) shown below:
(PAG3)
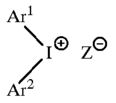
(PAG4)
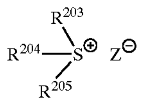

wherein $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^{203}$, $R^{204}$ and $R^{205}$ each independently represents a substituted or unsubstituted alkyl group or an aryl group, preferably an aryl group having from 6 to 14 carbon atoms, an alkyl group having from 1 to 8 carbon atoms, or a substituted derivative thereof. Preferred examples of the substituent include, for the aryl group, an alkoxy group having from 1 to 8 carbon atoms, an alkyl group having from 1 to 8 carbon atoms, a nitro group, a carboxyl group, a hydroxyl group and a halogen atom, and for the alkyl group, an alkoxy group having from 1 to 8 carbon atoms, a carboxyl group and an alkoxycarbonyl group.

$Z^-$ represents a counter anion and examples thereof include a perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, a pentafluorobenzene sulfonate anion, a condensed polynuclear aromatic sulfonate anion such as naphthalene-1-sulfonate anion, anthraquinone sulfonate anion, and a sulfonic acid group-containing dye, however, the present invention should not be construed as being limited thereto.

Two of $R^{203}$, $R^{204}$ and $R^{205}$ or $Ar^1$ and $Ar^2$may be combined through a single bond or a substituent.

Specific examples thereof include the following compounds, however, the present invention should not be construed as being limited thereto.

(PAG3-1)

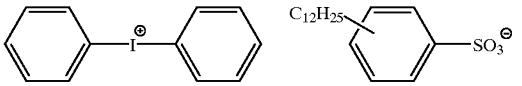

(PAG3-2)

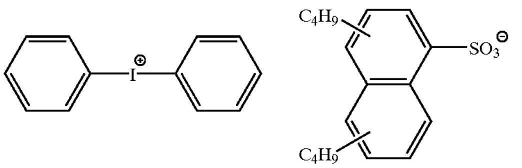

(PAG3-3)

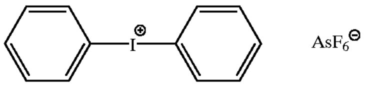

(PAG3-4)

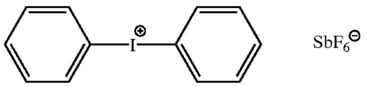

(PAG3-5)

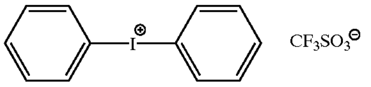

(PAG3-6)

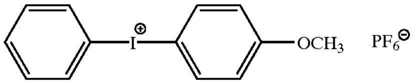

(PAG3-7)

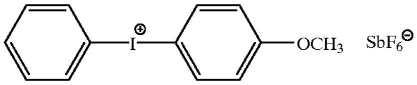

-continued (PAG3-8)

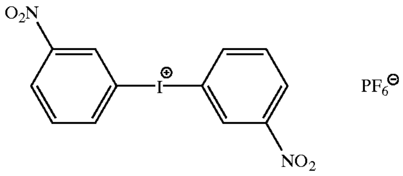

(PAG3-9)

(PAG3-10)

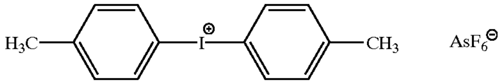

(PAG3-11)

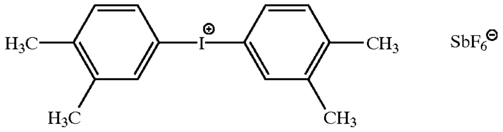

(PAG3-12)

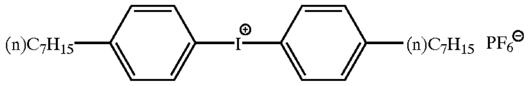

(PAG3-13)

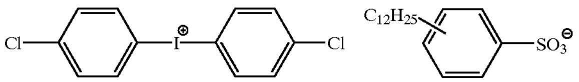

(PAG3-14)

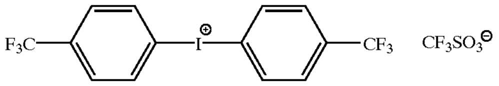

(PAG3-15)

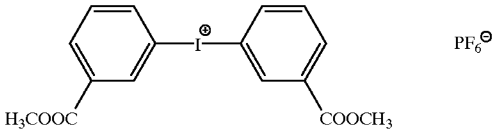

(PAG3-16)

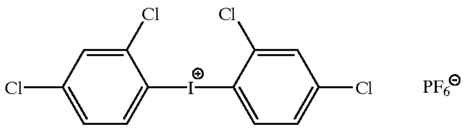

(PAG3-17)

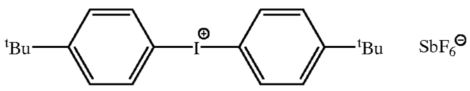

(PAG3-18)

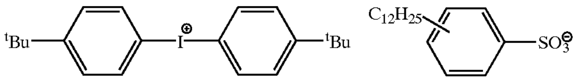

(PAG3-19)

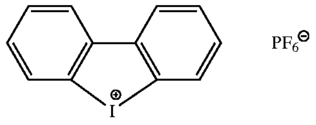

-continued
(PAG3-20)
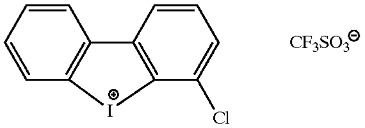
(PAG3-21)
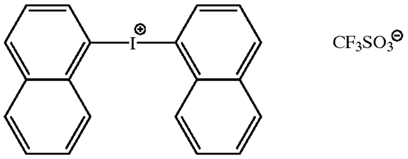
(PAG3-22)
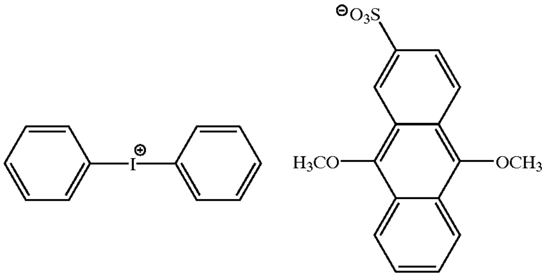
(PAG3-23)
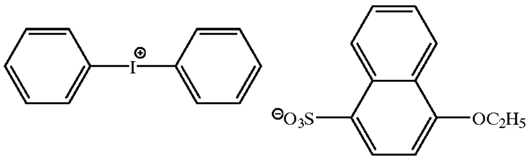
(PAG3-24)
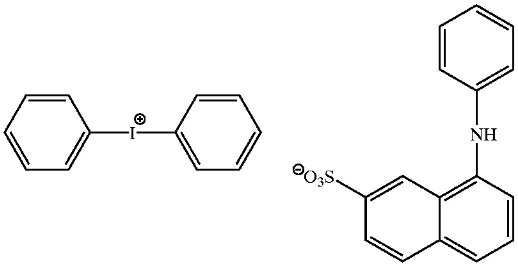
(PAG3-25)
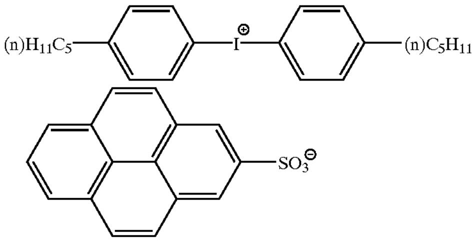
-continued
(PAG3-26)
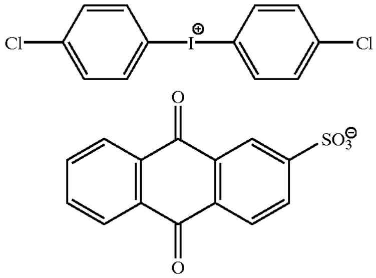
(PAG3-27)
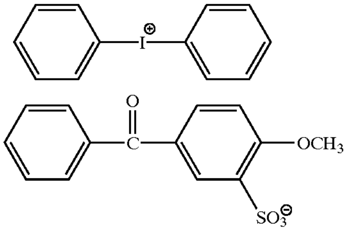
(PAG3-28)
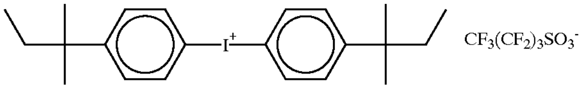
(PAG3-29)
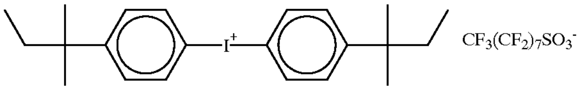
(PAG4-1)
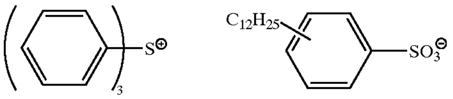
(PAG4-2)
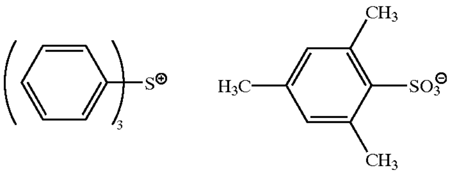
(PAG4-3)
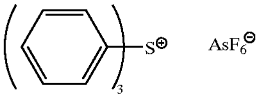
(PAG4-4)
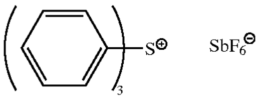
(PAG4-5)
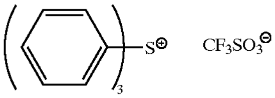
(PAG4-6)
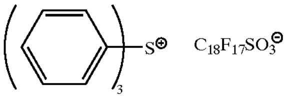

(PAG4-7)
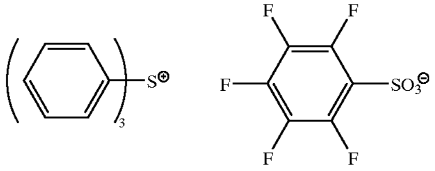
(PAG4-8)
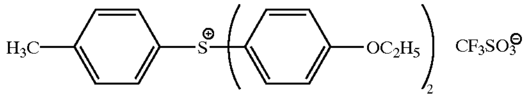
(PAG4-9)
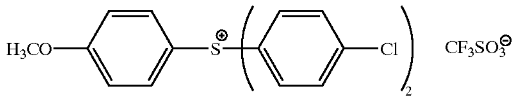
(PAG4-10)
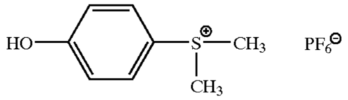
(PAG4-11)
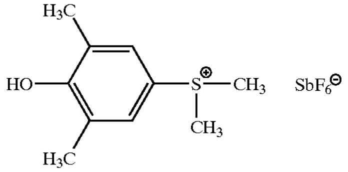
(PAG4-12)
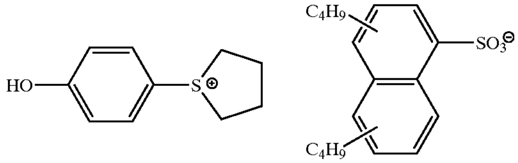
(PAG4-13)
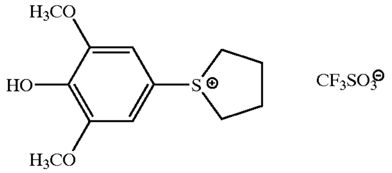
(PAG4-14)
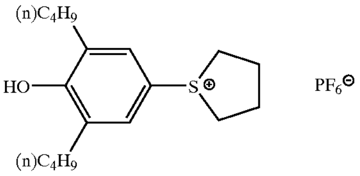
(PAG4-15)
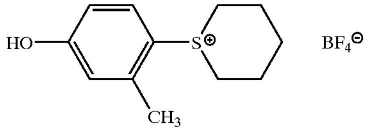
(PAG4-16)
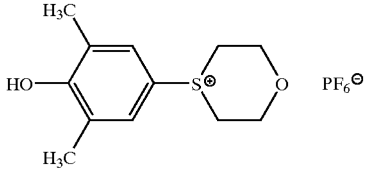
(PAG4-17)
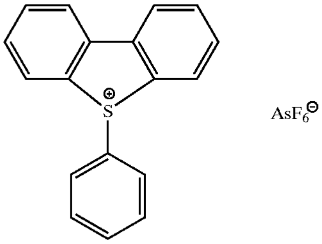
(PAG4-18)
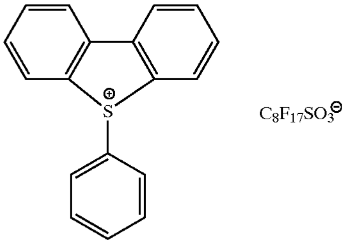
(PAG4-19)
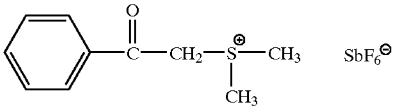
(PAG4-20)
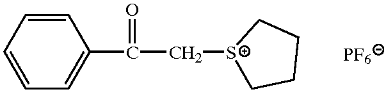
(PAG4-21)
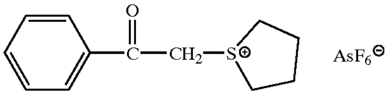
(PAG4-22)
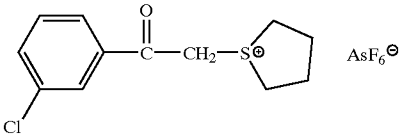
(PAG4-23)
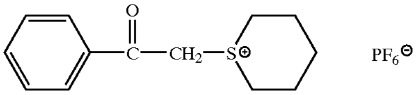
(PAG4-24)
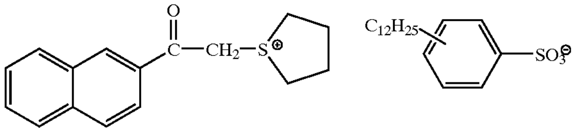
(PAG4-25)
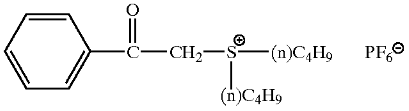
(PAG4-26)
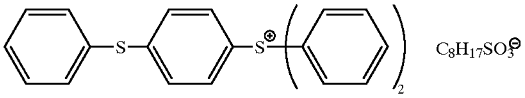

-continued (PAG4-27)

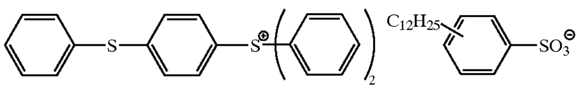

(PAG4-28)

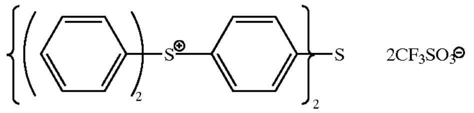

(PAG4-29)

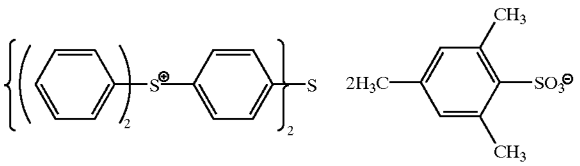

(PAG4-30)

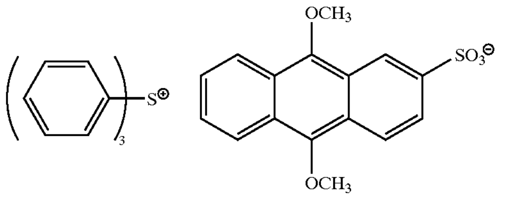

(PAG4-31)

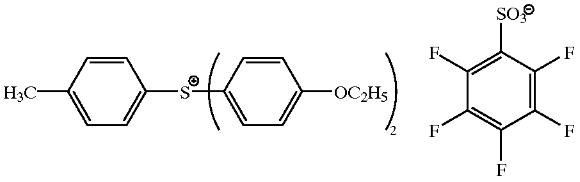

(PAG4-32)

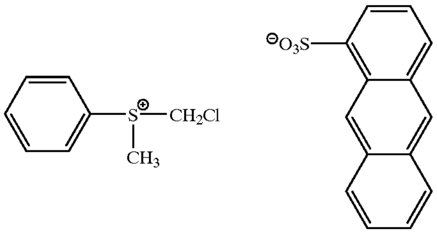

(PAG4-33)

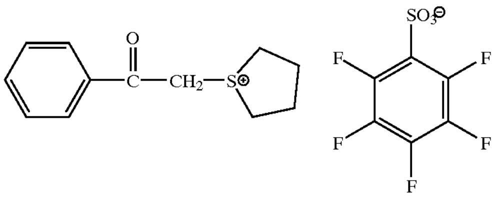

(PAG4-34)

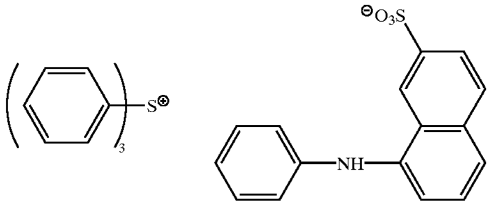

-continued (PAG4-35)

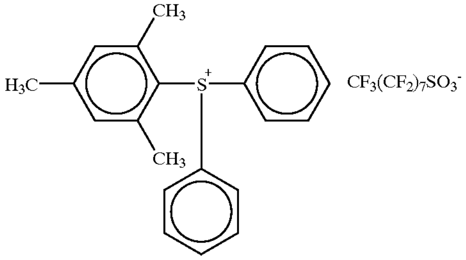

(PAG4-36)

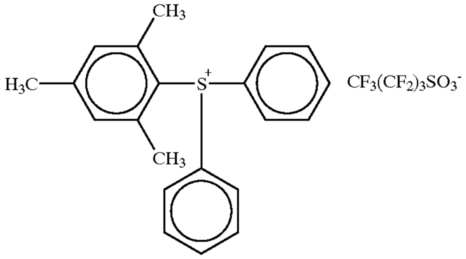

(PAG4-37)

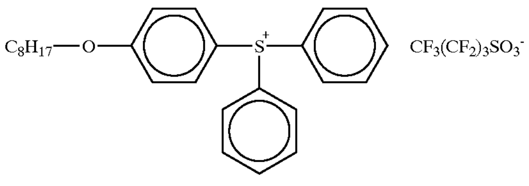

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51,3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivative represented by formula (PAG5) shown below or iminosulfonate derivative represented by formula (PAG6) shown below:

(PAG6)

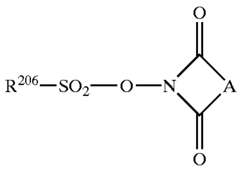

wherein $Ar^3$ and $Ar^4$ each independently represents a substituted or unsubstituted aryl group, $R^{206}$ represents a substituted or unsubstituted alkyl group or aryl group, and A represents a substituted or unsubstituted alkylene group, alkenylene group or arylene group.

Specific examples thereof include the following compounds, however, the present invention should not be construed as being limited thereto.

(PAG5-1)
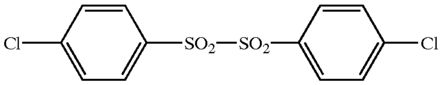
(PAG5-2)
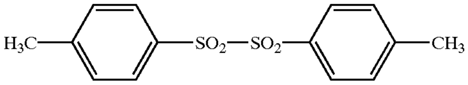
(PAG5-3)
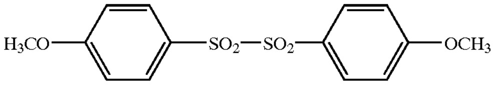
(PAG5-4)
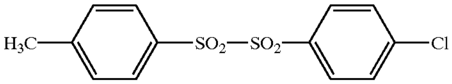
(PAG5-5)
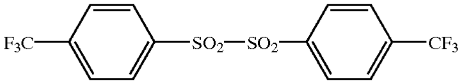
(PAG5-6)
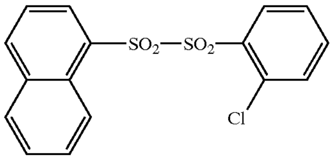
(PAG5-7)
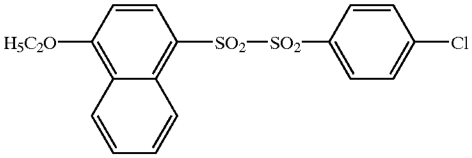
(PAG5-8)
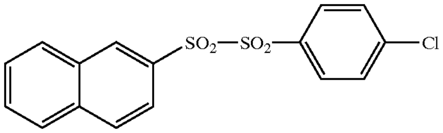
(PAG5-9)
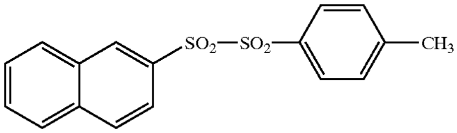
(PAG5-10)
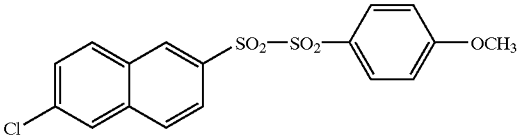
(PAG5-11)
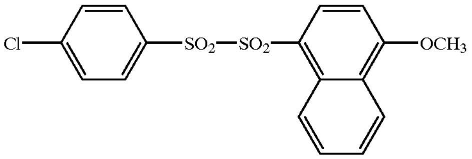
-continued
(PAG5-12)
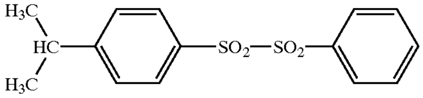
(PAG5-13)
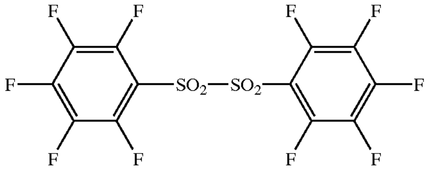
(PAG5-14)
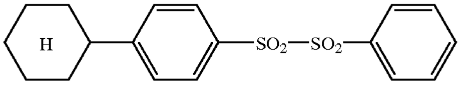
(PAG5-15)
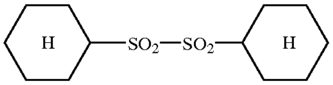
(PAG6-1)
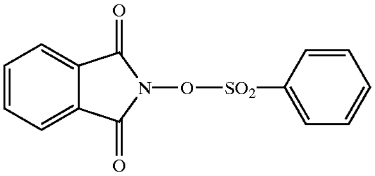
(PAG6-2)
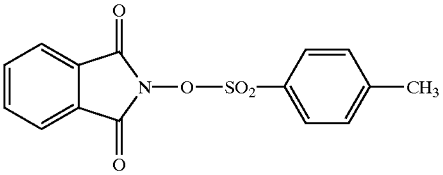
(PAG6-3)
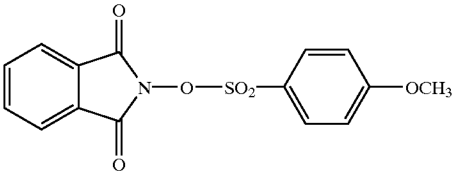
(PAG6-4)
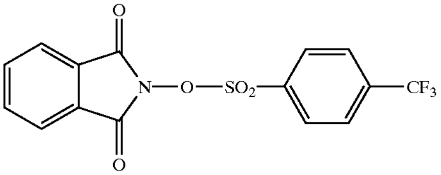
(PAG6-5)
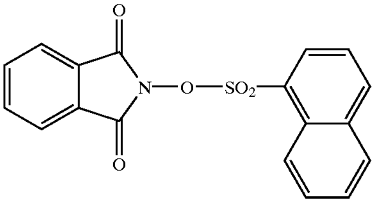

-continued (PAG6-6)

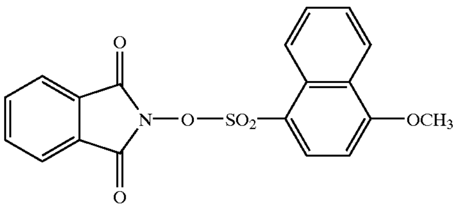

(PAG6-7)

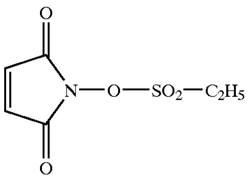

(PAG6-8)

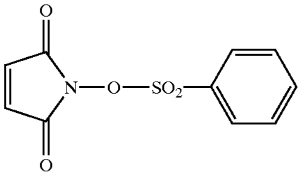

(PAG6-9)

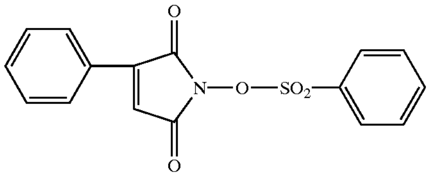

(PAG6-10)

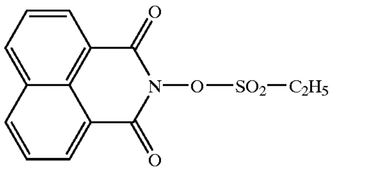

(PAG6-11)

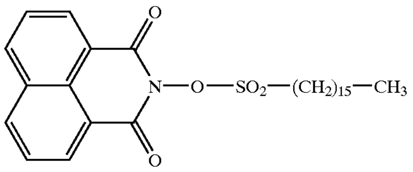

(PAG6-12)

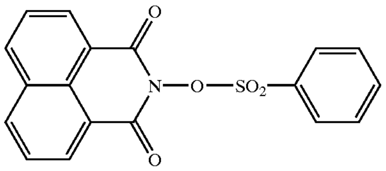

(PAG6-13)

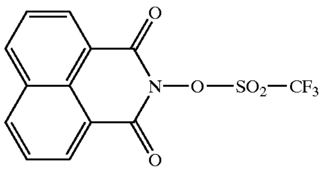

-continued (PAG6-14)

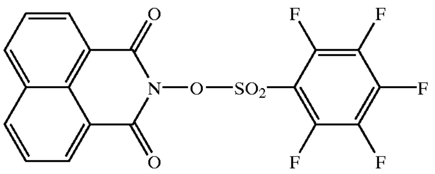

(PAG6-15)

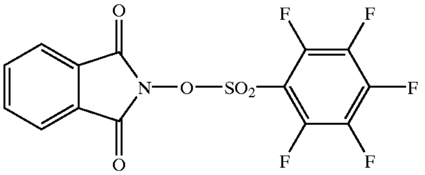

(PAG6-16)

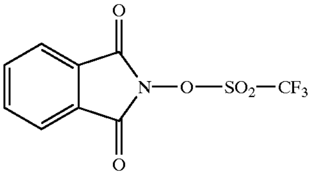

(PAG6-17)

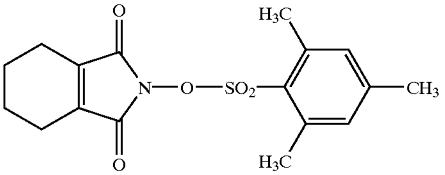

(PAG6-18)

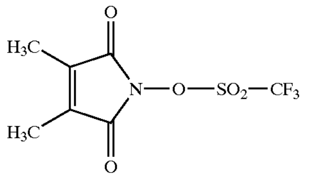

(PAG6-19)

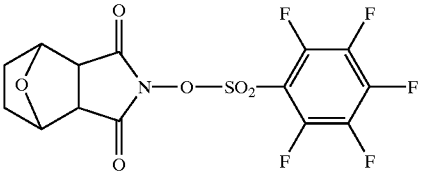

The addition amount of these compounds which decompose upon irradiation with actinic rays or a radiation to generate an acid is generally from 0.001 to 40 wt %, preferably from 0.01 to 20 wt %, more preferably from 0.1 to 5 wt %, based on the whole resist fluid (excluding the solvent). If the addition amount of the compounds which decompose and generate an acid upon irradiation with actinic rays or a radiation is smaller than 0.001 wt %, the resist has too low sensitivity. On the other hand, addition amounts thereof larger than 40 wt % are also undesirable in that the resist shows too intense light absorption, resulting in an impaired profile and a narrowed margin for processing (especially baking).

The positive resist fluid and the positive photoresist composition for far ultraviolet exposure of the present invention may optionally further contain other ingredients such as, e.g., acid-decomposable dissolution inhibitive compounds, dyes, plasticizers, surfactants, photosensitizers, organic basic compounds, and other compounds which accelerate dissolution in a developing solution.

For application to a substrate, the positive resist fluid of the present invention is used in the form of a solution in a solvent in which the ingredients described above dissolve. Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents may be used alone or as a mixture of two or more thereof.

More preferred of these solvents are 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone, and tetrahydrofuran.

Surfactants can be added to the solvent. Examples of the surfactants include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), and Asahi Guard AG710 and Surflon S-382, SC101, SC102, SC103, SC104, SC105, and SC106 (manufactured by Asahi Glass Co., Ltd.); organosiloxane polymer KP341 (manufactured by Shin-Etsu Chemical Co., Ltd.); and acrylic or methacrylic (co) polymers Polyflow No. 75 and No. 95 (manufactured by Kyoeisha Chemical Co., Ltd.). The incorporation amount of these surfactants is generally 2 parts by weight or smaller, preferably 1 part by weight or smaller, per 100 parts by weight of the solid ingredients of the resist fluid of the present invention.

These surfactants may be added alone or in combination of two or more thereof.

The positive resist fluid of the present invention described above is applied to a substrate to form a thin film. The thickness of this coating film is preferably from 0.4 to 1.5 $\mu$m.

A satisfactory resist pattern can be obtained by applying the resist fluid described above on a substrate such as those for use in the production of precision integrated-circuit elements (e.g., silicon/silicon dioxide coating) by an appropriate coating means, e.g., a spinner or coater, exposing the coating to light through a given mask, and then baking and developing the coating. Preferred examples of the exposure light include lights having a wavelength of from 150 to 250 nm. Specific examples thereof include KrF excimer laser light (248 nm), ArF excimer laser light (193 nm), $F_2$ excimer laser light (157 nm), X-rays, and electron beams.

More preferred of these exposure lights are those having a wavelength of 250 nm or shorter. Even more preferred are far ultraviolet rays having a wavelength of 220 nm or shorter.

The most preferred is ArF excimer laser light (193 nm).

As a developing solution, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the invention should not be construed as being limited thereto.

Synthesis of Photo-acid Generator (PAG 4-35)

In 800 mL of mesitylene was dissolved 50 g of diphenyl sulfoxide. Thereto was added 200 g of aluminum chloride. This mixture was stirred at 80° C. for 24 hours. After completion of the reaction, the reaction mixture was gradually poured on 2 L of ice. Thereto was added 400 mL of concentrated hydrochloric acid. This mixture was heated at 70° C. for 10 minutes. The resultant reaction mixture was cooled to room temperature, washed with ethyl acetate, and then filtered. A solution of 200 g of ammonium iodide in 400 mL of distilled water was added to the filtrate. The particles thus precipitated were taken out by filtration, washed with water and ethyl acetate, and then dried to obtain 72 g of a sulfonium iodide.

In 300 mL of methanol was dissolved 50 g of the sulfonium iodide obtained above. Thereto was added 31 g of silver oxide. This mixture was stirred for 4 hours. The resultant reaction mixture was filtered and then subjected to salt exchange with potassium heptadecafluorooctanesulfonate to recover 40 g of the target compound (PAG 4-35).

Synthesis of Monomers (1) Synthesis of Monomer (1)

In 400 mL of acetonitrile was dissolved 34 g of methanesulfonamide. Thereto were added 50 g of triethylamine and 2.5 g of 4-dimethylaminopyridine. While this mixture was kept being cooled on an ice bath at 0° C., 21 g of methacryloyl chloride was added dropwise thereto over 1 hour. After completion of the addition, the ice bath was removed and the reaction mixture was stirred for 6 hours while allowing the mixture to warm up to room temperature. After completion of the reaction, the reaction mixture was poured into 3 L of distilled water to conduct crystallization, subsequently made strongly acidic with concentrated hydrochloric acid, and then extracted with ethyl acetate. The organic layer was concentrated and the reaction product obtained was purified by silica gel column chromatography to recover 46 g of monomer (1) as the target compound.

(2) Synthesis of Monomer (17)

Potassium styrenesulfonate was converted to the corresponding sulfonyl chloride with 50 g of phosphorus oxychloride by an ordinary method. This sulfonyl chloride was dispersed in 200 mL of ethyl acetate, and 50 mL of 25% ammonia water was added dropwise thereto with cooling with ice. After completion of the addition, the reaction mixture was stirred at room temperature for 1 hour to complete the reaction. Thereafter, the reaction mixture was poured into 1 L of distilled water to conduct crystallization, subsequently made strongly acidic with hydrochloric acid, and then extracted with ethyl acetate to recover the reaction product. The organic layer obtained was washed with an aqueous sodium bicarbonate solution and with saturated aqueous sodium chloride solution and then concentrated to recover 45 g of styrenesulfonamide.

In 400 mL of N,N-dimethylformamide was dissolved 18 g of the styrenesulfonamide obtained above. Thereto were added 30 g of triethylamine and 1.2 g of 4-dimethylaminopyridine. While this mixture was kept being cooled on an ice bath at 0° C., 16 g of o-toluyl chloride was added dropwise thereto over 1 hour. After completion of the addition, the ice bath was removed and the reaction mixture was stirred for 3 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 26 g of monomer (17) as the target compound.

(3) Synthesis of Monomer (31)

Monomer (31) was synthesized in the same manner as in Synthesis Example (2), except that acetyl chloride was used in place of the o-toluyl chloride used in Synthesis Example (2).

(4) Synthesis of Monomer (40)

In 400 mL of acetonitrile was dissolved 18 g of the styrenesulfonamide obtained in Synthesis Example (2). Thereto were added 32 g of triethylamine and 1.2 g of 4-dimethylaminopyridine. While this mixture was kept being cooled on an ice bath at 0° C., 28 g of o-toluenesulfonyl chloride was added dropwise thereto over 1 hour. After completion of the addition, the ice bath was removed and the reaction mixture was stirred for 10 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 27 g of monomer (40) as the target compound.

(5) Synthesis of Monomer (51)

In 100 mL of tetrahydrofuran was dissolved 17 g of p-aminobenzenesulfonamide. This solution was cooled to 0° C. on an ice bath. To this solution was dropwise added 5 g of acryloyl chloride. After completion of the addition, the ice bath was removed and the reaction mixture was warmed to room temperature and stirred for 1 hour. Subsequently, the reaction mixture was heated at 60° C. for 1 hour. After completion of the reaction, the reaction mixture was poured into 1 L of distilled water. Thus, N-(p-aminosulfonylphenyl) acrylamide was obtained as precipitated white particles.

In acetonitrile was dissolved 23 g of the N-(p-aminosulfonylphenyl)acrylamide obtained above. Thereto were added 30 g of triethylamine and 1.5 g of 4-dimethylaminopyridine. While this mixture was kept being cooled on an ice bath at 0° C., 18 g of o-chlorobenzoyl chloride was added dropwise thereto over 1 hour. After completion of the addition, the ice bath was removed and the reaction mixture was stirred for 5 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 27 g of monomer (51) as the target compound.

(6) Synthesis of Monomer (66)

The N-(p-aminosulfonylphenyl)acrylamide obtained in Synthesis Example (5) was reacted with p-toluene isocyanate in a mixed solvent consisting of N,N-dimethylformamide and triethylamine in a ratio of 1/1. The reaction product was subjected to the same post-treatments as in Synthesis Example (5) to synthesize monomer (66) as the target compound.

(7) Synthesis of Monomer (73)

Commercial 2-acrylamido-2-methylpropanesulfonic acid (AMPS) was converted to the corresponding sulfonyl chloride with phosphorus oxychloride by an ordinary method. This sulfonyl chloride was dispersed in 200 mL of ethyl acetate, and 25% ammonia water was added dropwise thereto with cooling with ice. After completion of the addition, the reaction mixture was stirred at room temperature for 1 hour to complete the reaction. Thereafter, the reaction mixture was poured into distilled water to conduct crystallization, subsequently made strongly acidic with hydrochloric acid, and then extracted with ethyl acetate to recover the reaction product. The organic layer obtained was washed with an aqueous sodium bicarbonate solution and with saturated aqueous sodium chloride solution and then concentrated to recover the sulfonamide of AMPS.

In 400 mL of N,N-dimethylformamide was dissolved 21 g of the AMPS sulfonamide obtained above. Thereto were added 30 g of triethylamine and 1.2 g of 4-dimethylaminopyridine. While this mixture was kept being cooled on an ice bath at 0° C., 20 g of 3,5-dichlorobenzoyl chloride was added dropwise thereto over 1 hour. After completion of the addition, the ice bath was removed and the reaction mixture was stirred for 3 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 31 g of monomer (73) as the target compound.

(8) Synthesis of Monomer (81)

In 400 mL of N,N-dimethylformamide was dissolved 19 g of methanesulfonamide. Thereto were added 50 g of triethylamine and 2.5 g of 4-dimethylaminopyridine. While this mixture was kept being cooled on an ice bath at 0° C., 21 g of acryloyl chloride was added dropwise thereto over 1 hour. After completion of the addition, the ice bath was removed and the reaction mixture was stirred for 3 hours while allowing the mixture to warm up to room temperature. After completion of the reaction, the solvent, excess amine, and other volatile substances were distilled off under reduced pressure. Thereafter, the system was cooled, subsequently neutralized with hydrochloric acid, and then subjected to vacuum distillation again. The resultant residue was added to 500 mL of saturated aqueous sodium chloride solution which had been made strongly acidic to thereby conduct crystallization. This mixture was extracted with methyl ethyl ketone (MEK) and ethyl acetate, and the organic layer was concentrated to recover 35 g of monomer (81) as the target compound.

(9) Synthesis of Monomer (83)

In 200 mL of ethyl acetate was dispersed 20 g of camphorsulfonyl chloride. Thereto was dropwise added 30 mL of 25% ammonia water with cooling with ice. After completion of the addition, the reaction mixture was stirred at room temperature for 1 hour to complete the reaction. Thereafter, the reaction mixture was poured into 500 mL of distilled water to conduct crystallization, subsequently made strongly acidic with hydrochloric acid, and then extracted with ethyl acetate to recover the reaction product. The organic layer obtained was washed with an aqueous sodium bicarbonate solution and with saturated aqueous sodium chloride solution and then concentrated to recover 18 g of camphorsulfonamide.

In 400 mL of N,N-dimethylformamide was dissolved 18 g of the camphorsulfonamide obtained above. Thereto were added 16.8 g of triethylamine and 1.5 g of 4-dimethylaminopyridine. While this mixture was kept being cooled on an ice bath at 0° C., 9 g of methacryloyl chloride was added dropwise thereto over 1 hour. After completion of the addition, the ice bath was removed and the reaction mixture was stirred for 3 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 21 g of monomer (83) as the target compound.

(10) Synthesis of Monomer (86)

The potassium salt of 3-sulfopropyl methacrylate was converted to the corresponding sulfonyl chloride with phosphorus oxychloride by an ordinary method. The sulfonyl chloride obtained was reacted with methanesulfonamide in acetonitrile in the presence of triethylamine and 4-dimethylaminopyridine. The reaction mixture was subjected to crystallization with water. Thereafter, the target compound was extracted with ethyl acetate and purified by silica gel column chromatography to obtain monomer (86) as the target compound.

(11) Synthesis of Monomer (88)

Monomer (88) was synthesized in the same manner as in Synthesis Example 3, except that camphorsulfonamide was used in place of the methanesulfonamide used in Synthesis Example (3).

(12) Synthesis of Monomer (91)

Monomer (91) was synthesized in the same manner as in Synthesis Example 1, except that Calenz MOI was used in place of the methacryloyl chloride in Synthesis Example (1) and reacted under basic conditions.

(13) Synthesis of Monomer (105)

Monomer (105) was synthesized in the same manner as in Synthesis Example (7), except that the potassium salt of 3-sulfonylpropyl methacrylate and benzoyl chloride were used respectively in place of the AMPS and 3,5-dichlorobenzoyl chloride used in Synthesis Example (7).

Resin Syntheses 1

(1) Synthesis of Resin (i) shown above

Into a vessel were introduced t-butoxystyrene and monomer (1) described above in a ratio of 9/1. The monomer mixture was dissolved in an N,N-dimethylacetamide/tetrahydrofuran=2/8 mixed solvent to prepare 100 mL of a solution having a solid concentration of 20%. To this solution was added V-65, manufactured by Wako Pure Chemical Industries, Ltd., in an amount of 1 mol %. In a nitrogen atmosphere, this mixture was added dropwise over 2 hours to 10 mL of tetrahydrofuran heated at 60° C. After completion of the addition, the reaction mixture was heated with stirring for 6 hours. After completion of the reaction, the reaction mixture was cooled to room temperature and then poured into 3 L of methanol to conduct crystallization. The white particles thus precipitated were recovered.

Subsequently, the white particles obtained were hydrolyzed under acidic conditions to eliminate part of the protecting t-butoxy groups. Thus, resin (i) was obtained as the target compound. $^{13}C$ NMR spectrometry revealed that this polymer had a proportion among monomer units of 22/67/11. The polymer had a weight-average molecular weight, as measured by GPC and calculated for standard polystyrene, of 7,800.

(2) Syntheses of Resins (ii) to (xix) shown above

Resins (ii) to (xix) which each had the monomer unit proportions and weight-average molecular weight shown in Table 1 given below were synthesized by conducting the same procedure as in the synthesis of resin (i). In the table, the repeating units 1 to 3 for each resin respectively correspond to the left, middle, and right repeating units, except the unit represented by general formula (I), in the above-described structural formula representing resin examples.

TABLE 1

| | Proportions of repeating units (mol %) | | | | Weight- |
|---|---|---|---|---|---|
| Resin | General formula (I) | Repeating unit 1 | Repeating unit 2 | Repeating unit 3 | average molecular weight |
| (ii) | 12 | 23 | 65 | | 8900 |
| (iii) | 13 | 21 | 66 | | 7600 |
| (iv) | 8 | 25 | 67 | | 8700 |
| (v) | 11 | 24 | 65 | | 8600 |
| (vi) | 11 | 18 | 71 | | 8200 |
| (vii) | 12 | 16 | 50 | 22 | 7700 |
| (viii) | 13 | 17 | 70 | | 6900 |
| (ix) | 15 | 18 | 67 | | 7100 |
| (x) | 10 | 17 | 73 | | 7200 |
| (xi) | 35 | 25 | 40 | | 8100 |
| (xii) | 33 | 20 | 47 | | 8300 |
| (xiii) | 32 | 28 | 40 | | 8500 |
| (xiv) | 11 | 22 | 50 | 17 | 8900 |
| (xv) | 10 | 11 | 23 | 56 | 7800 |
| (xvi) | 12 | 57 | 31 | | 7700 |
| (xvii) | 13 | 24 | 63 | | 7900 |
| (xviii) | 12 | 54 | 21 | 13 | 8000 |
| (xix) | 9 | 26 | 65 | | 8600 |

Resin Syntheses 2

(1) Synthesis of Resin (I)

Into a vessel were introduced 1-adamantyl acrylate, 3-oxocyclohexyl methacrylate, and monomer (81) described above in a ratio of 45/45/10. The monomer mixture was dissolved in an N,N-dimethylacetamide/tetrahydrofuran=8/2 mixed solvent to prepare 100 mL of a solution having a solid concentration of 20%. To this solution was added v-65, manufactured by Wako Pure Chemical Industries, Ltd., in an amount of 5 mol %. In a nitrogen atmosphere, this mixture was added dropwise over 3 hours to 10 mL of tetrahydrofuran heated at 60° C. After completion of the addition, the reaction mixture was heated with stirring for 6 hours. After completion of the reaction, the reaction mixture was cooled to room temperature and then poured into 3 L of methanol to conduct crystallization. The white particles thus precipitated were recovered.

$^{13}C$ NMR spectrometry revealed that this resin (I) obtained had a proportion among monomer units of 46/44/10. The polymer had a weight-average molecular weight, as measured by gel permeating chromatography (GPC) and calculated for standard polystyrene, of 8,900.

(2) Syntheses of Resins (II) to (X)

Resins (II) to (X) which each had the structure shown below and had the monomer unit proportions and weight-average molecular weight shown in Table 2 given below were synthesized by conducting the same procedure as in the synthesis of resin (I). In the table, the repeating units 1 and 2 for each resin respectively correspond to the left and right repeating units, except the unit represented by general formula (I), in the following structural formula representing the resin.

(I)

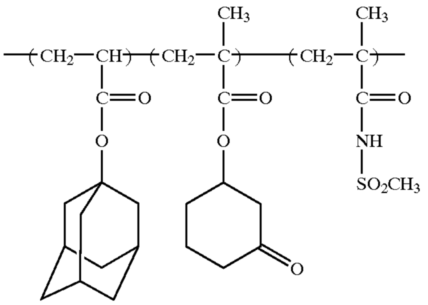

(II)

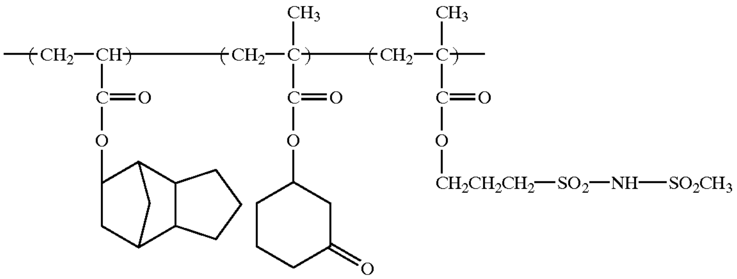

(III)

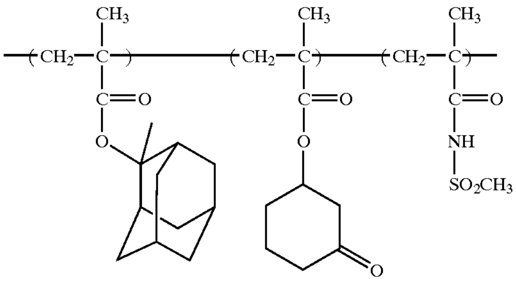

(IV)

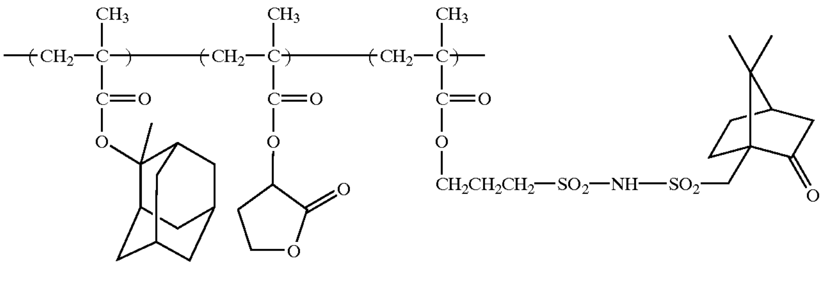

(V)

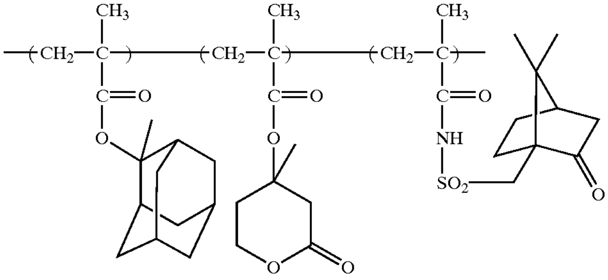

-continued
(VI)
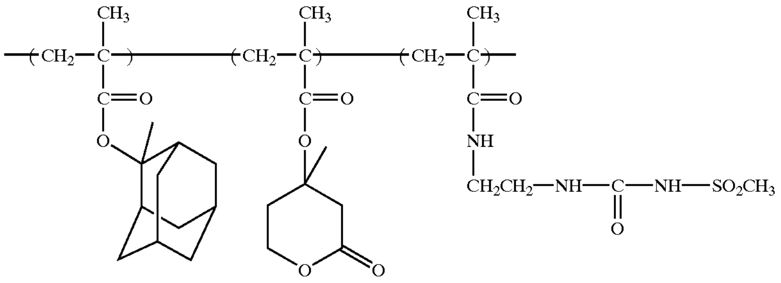
(VII)
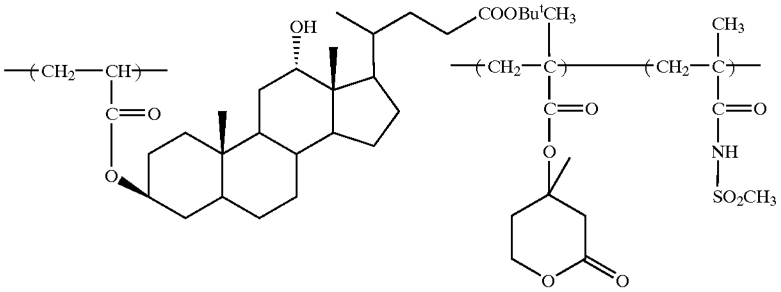
(VIII)
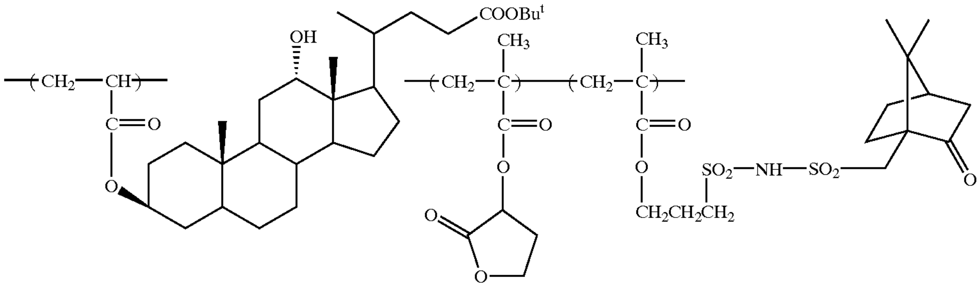
(IX)
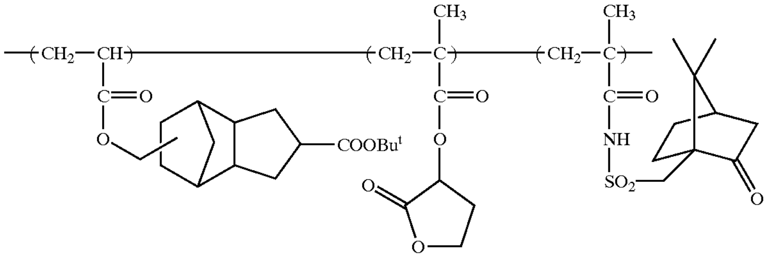
(X)
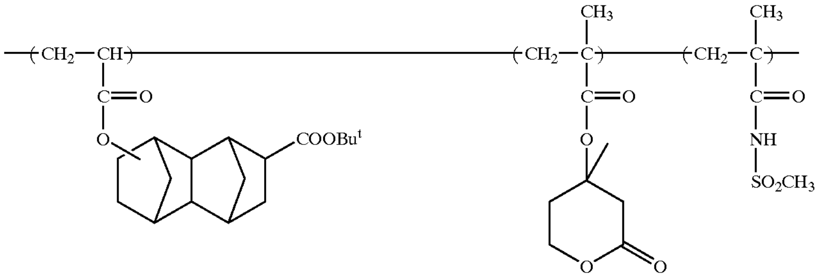

TABLE 2

| Resin | Proportions of repeating units (mol %) General formula (I) | Repeating unit 1 | Repeating unit 2 | Weight-average molecular weight |
|---|---|---|---|---|
| (II) | 12 | 44 | 44 | 9200 |
| (III) | 11 | 45 | 44 | 8400 |
| (IV) | 7 | 46 | 43 | 8700 |
| (V) | 9 | 45 | 46 | 8400 |
| (VI) | 11 | 47 | 42 | 8900 |
| (VII) | 12 | 42 | 46 | 7900 |
| (VIII) | 10 | 43 | 47 | 9900 |
| (IX) | 13 | 46 | 41 | 7800 |
| (X) | 11 | 44 | 45 | 8200 |
| (XI) | 35 | 25 | 40 | 8100 |

EXAMPLES 1 TO 19 AND COMPARATIVE EXAMPLE 1

Preparation and Evaluation of Photosensitive Compositions

To 2 g of each of the resins shown in Tables 3 and 4 were added 0.04 g of photo-acid generator (PAG 3-1) described above and 0.02 g of 4-dimethylaminopyridine. Each mixture was dissolved in 9.5 g of propylene glycol monomethyl ether acetate, and the resultant solution was filtered through a 0.2-μm filter. Thus, positive resist fluids were prepared.

TABLE 3

| | Resin | Defocus latitude depended on line pitch | Change in sensi-tivity | Change in film thickness reduction | Number of particles increased |
|---|---|---|---|---|---|
| Example 1 | i | 0.9 μm | <5% | nil | <5 |
| Example 2 | ii | 0.9 μm | <5% | nil | <5 |
| Example 3 | iii | 0.9 μm | <5% | nil | <5 |
| Example 4 | iv | 1.0 μm | <5% | nil | <5 |
| Example 5 | v | 1.0 μm | <5% | nil | <5 |
| Example 6 | vi | 1.0 μm | <5% | nil | <5 |
| Example 7 | vii | 1.0 μm | <5% | nil | <5 |
| Example 8 | viii | 1.0 μm | <5% | nil | <5 |
| Example 9 | ix | 0.9 μm | <5% | nil | <5 |
| Example 10 | x | 1.0 μm | <5% | nil | <5 |
| Example 11 | xi | 0.9 μm | <5% | nil | <5 |

TABLE 4

| | Resin | Defocus latitude depended on line pitch | Change in sensi-tivity | Change in film thickness reduction | Number of particles increased |
|---|---|---|---|---|---|
| Example 12 | xii | 0.9 μm | <5% | nil | <5 |
| Example 13 | xiii | 0.9 μm | <5% | nil | <5 |
| Example 14 | xvi | 1.0 μm | <5% | nil | <5 |
| Example 15 | xv | 0.9 μm | <5% | nil | <5 |
| Example 16 | xvi | 1.0 μm | <5% | nil | <5 |
| Example 17 | xvii | 1.0 μm | <5% | nil | <5 |
| Example 18 | xviii | 0.9 μm | <5% | nil | <5 |
| Example 19 | xix | 0.9 μm | <5% | nil | <5 |
| Comparative Example 1 | R1 | 0.5 μm | 15% | 10% | 150 |

(Evaluation Test)

These resist fluids each was applied to a silicon wafer with a spin coater, and the coating was dried at 110° C. for 90 seconds with a vacuum suction type hot plate to obtain a resist film having a thickness of 0.83 μm.

These resist films were exposed to light using a 248-nm KrF excimer laser stepper (NA=0.42). Immediately after the exposure, the resist films each was heated with a 100° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were examined for profile.

These resist patterns were evaluated for defocus latitude depended on line pitch and for long-term stability. [Defocus Latitude Depended on Line Pitch]: In each of a line-and-space pattern (a pattern having densely disposed lines) and an isolated-line pattern (a pattern having thinly disposed lines) each having a line width of 0.25 μm, the focus latitude overlap range having a tolerance of 0.25 μm±10% was determined. The larger the range, the better the defocus latitude depended on line pitch.

[Long-term Stability]:

(Change in Sensitivity) Each resist fluid prepared above was stored at 30° C. for 1 month and then evaluated for sensitivity. The resultant change in sensitivity from the value obtained before the storage was determined. In this test, sensitivity was expressed in terms of exposure amount necessary for reproducing a pattern having a line width of 0.25 μm, and values of such sensitivity are given as relative values, with the sensitivity value for Example 1 being 1.

(Change in Film Thickness Reduction) With respect to each of resist patterns respectively formed from each resist fluid before and after the storage, an unexposed area was examined for profile with a scanning electron microscope to measure the film thickness after development. The difference in film thickness between the unexposed film and the developed film (film thickness reduction) was determined. The change in film thickness reduction through the storage was determined.

(Number of Particles Increased) Each resist fluid prepared was examined for the number of particles contained therein, immediately after the preparation thereof and after the resist fluid had been stored at 30° C. for 1 month. The number of particles increased through the storage was evaluated.

The results of these evaluations are shown in Tables 3 and 4.

In Comparative Example 1, a positive resist fluid was prepared and evaluated in the same manner as in Example 1, except that a t-butoxycarbonyloxystyrene/N-(4-vinylbenzyl) methanesulfonamide copolymer R1 (monomer unit ratio, 1:1; weight-average molecular weight, 38,800) synthesized according to the synthesis method described in the Example 3 of JP-A-9-90638 was used in place of the resin used in Example 1.

As apparent from the results given in Tables 3 and 4, the resist fluid of the Comparative Example was insufficient in both defocus latitude depended on line pitch and long-term stability. In contrast, the positive resist fluids according to the present invention were on a satisfactory level with respect to each of these performances. Namely, the resist fluids of the invention were suitable for use in lithography using far ultraviolet rays including KrF excimer laser light.

EXAMPLES 20 To 29 AND COMPARATIVE EXAMPLE 2

To 1.4 g of each of the resins shown in Table 5 synthesized in Synthesis Examples given above were added 0.18 g of a photo-acid generator and 10 mg of 1,5-diazabicyclo[4.3.0]-5-nonene (DBN). Each mixture was dissolved in propylene glycol monoethyl ether acetate in a solid concentration of 14 wt %. These solutions were filtered through a 0.1-μm microfilter to prepare positive resist fluids of Examples 20 to 29.

In Comparative Example 2, a positive resist fluid was prepared in the same manner as in Examples 20 to 29, except that the following resin R2 was used together with a photoacid generator.

(Resin R2)

Resin R2 was synthesized according to the synthesis method described in JP-A-9-90637, page (18), Example 13. Namely, a (±)-mevalonolactone methacrylate/2-methyl-2-adamantyl methacrylate copolymer was synthesized in the following manner.

Into a sufficiently dried, 100-mL eggplant type flask containing a Teflon™-coated stirrer bar were introduced 4.96 g (25 mmol) of (±)-mevalonolactone methacrylate, 5.8 g (25 mmol) of 2-methyl-2-adamantyl methacrylate, 16.7 mL of dioxane, and 1.23 g (9 mmol) of azobisisobutyronitrile (AIBN). The contents were stirred in a nitrogen atmosphere at 80° C. for 8 hours. The reaction mixture was diluted with tetrahydrofuran (THF) and then dropped into 1 L of methanol containing a small amount of hydroquinone. The resultant precipitate was taken out by filtration with a glass filter and dried at 0.1 mmHg and 45° C. for 16 hours. The white powder obtained was dissolved in THF and the same precipitation/drying operation as described above was repeatedly conducted twice to obtain the target copolymer as a white powder. Yield=7.44 g (68.7%). The copolymer obtained had a lactone/adamantyl copolymerization ratio of 46.5/53.5, a weight-average molecular weight (calculated for standard polystyrene) of 14,000, and a dispersity ratio of 2.0.

TABLE 5

| | Resin | Photo-acid generator | Defocus latitude depended on line pitch | Change in sensitivity | Change in film thickness reduction | Number of particles increased |
|---|---|---|---|---|---|---|
| Example 20 | I | PAG-1 | 0.8 μm | <5% | nil | <5 |
| Example 21 | II | PAG-2 | 0.8 μm | <5% | nil | <5 |
| Example 22 | III | PAG-1 | 1.1 μm | <5% | nil | <5 |
| Example 23 | IV | PAG-1 | 1.1 μm | <5% | nil | <5 |
| Example 24 | V | PAG-1 | 1.2 μm | <5% | nil | <5 |
| Example 25 | VI | PAG-1 | 1.2 μm | <5% | nil | <5 |
| Example 26 | VII | PAG-2 | 0.9 μm | <5% | nil | <5 |
| Example 27 | VIII | PAG-2 | 0.9 μm | <5% | nil | <5 |
| Example 28 | IX | PAG-2 | 0.9 μm | <5% | nil | <5 |
| Example 29 | X | PAG-1 | 0.9 μm | <5% | nil | <5 |
| Comparative Example 2 | R2 | PAG-1 | 0.2 μm | <5% | nil | <5 |

In Table 5, PAG-1 represents triphenylsulfonium triflate and PAG-2 represents (PAG 4-35) synthesized above.

(Evaluation Test)

Each of the positive photoresist fluids obtained was applied to a silicon wafer with a spin coater, and the coating was dried at 130° C. for 90 seconds to form a positive photoresist film having a thickness of about 0.5 μm. These photoresist films were exposed with an ArF excimer laser (exposed using a stepper having a wavelength of 193 nm and an NA of 0.55). After the exposure, the resist films were heated at 130° C. for 90 seconds, developed with a 2.38% aqueous solution of tetramethylammonium hydroxide, and then rinsed with distilled water to obtain resist pattern profiles.

These resist patterns were evaluated for defocus latitude depended on line pitch by the following method, and further evaluated for long-term stability in the same manner as in Examples 1 to 19. The results of these evaluations are shown. in Table 5. [Defocus Latitude Depended on Line Pitch]: In each of a line-and-space pattern (a pattern having densely disposed lines) and an isolated-line pattern (a pattern having thinly disposed lines) each having a line width of 0.22 μm, the focus latitude overlap range having a tolerance of 0.22 μm±10% was determined. The larger the range, the better the defocus latitude depended on line pitch.

As apparent from the results given in Table 5, the positive resist fluids according to the present invention were on a satisfactory level with respect to each of the performances. Namely, the resist fluids of the invention were suitable for use in lithography using far ultraviolet rays including ArF excimer laser light.

As demonstrated above, the present invention can provide a positive resist fluid excellent in defocus latitude depended on line pitch and in long-term stability.

Synthesis Examples given below describe the syntheses of monomers each having a group represented by general formula (qI). Each monomer is indicated by the same number as the corresponding compound given hereinabove as a monomer example.

Synthesis of Monomer (q1)

In 400 mL of N,N-dimethylformamide was dissolved 19 g of methanesulfonamide. Thereto were added 50 g of triethylamine and 2.5 g of 4-dimethylaminopyridine. While this mixture was kept being cooled on a water bath at 0° C., 21 g of methacryloyl chloride was added dropwise thereto over 1 hour. After completion of the addition, the water bath was removed and the reaction mixture was stirred for 3 hours while allowing the mixture to warm up to room temperature. After completion of the reaction, the solvent, excess amine, and other volatile substances were distilled off under reduced pressure. Thereafter, the system was cooled, subsequently neutralized with hydrochloric acid, and then subjected to vacuum distillation again. The resultant residue was added to 500 mL of saturated aqueous sodium chloride solution which had been made strongly acidic to thereby conduct crystallization. This mixture was extracted with MEK and ethyl acetate, and the organic layer was concentrated to recover 35 g of monomer (q1) as the target compound.

Synthesis of Monomer (q7)

In 200 mL of ethyl acetate was dispersed 20 g of camphorsulfonyl chloride. Thereto was dropwise added 30 mL of 25% ammonia water with cooling with ice. After completion of the addition, the reaction mixture was stirred at room temperature for 1 hour to complete the reaction. Thereafter, the reaction mixture was poured into 500 mL of distilled water to conduct crystallization, subsequently made strongly acidic with hydrochloric acid, and then extracted with ethyl acetate to recover the reaction product. The organic layer obtained was washed with an aqueous sodium bicarbonate solution and with saturated aqueous sodium chloride solution and then concentrated to recover 18 g of camphorsulfonamide.

In 400 mL of N,N-dimethylformamide was dissolved 18 g of the camphorsulfonamide obtained above. Thereto were added 16.8 g of triethylamine and 1.5 g of 4-dimethylaminopyridine. While this mixture was kept being cooled on a water bath at 0° C., 9 g of methacryloyl chloride was added dropwise thereto over 1 hour.

After completion of the addition, the water bath was removed and the reaction mixture was stirred for 3 hours while allowing the mixture to warm up to room temperature. After completion of the reaction, the system was neutralized with hydrochloric acid and then extracted with ethyl acetate. The organic layer was concentrated and the reaction product obtained was purified by silica gel column chromatography to recover 21 g of monomer (q7) as the target compound.

Synthesis of Monomer (q15)

The potassium salt of 3-sulfopropyl methacrylate was converted to the corresponding sulfonyl chloride with phosphorus oxychloride by an ordinary method. To a solution of 6 g of propylamine in 300 mL of pyridine was dropwise added 23 g of the acid chloride at 0° C. over 1 hour. After completion of the addition, the reaction mixture was stirred at room temperature for 3 hours. Thereafter, the reaction mixture was poured into 3 L of distilled water to conduct crystallization. The aqueous layer was removed by decantation, and the precipitate was purified by silica gel column chromatography to obtain 19 g of monomer (q15) as the target compound.

Synthesis of Monomer (q31)

The sulfonyl chloride obtained in the synthesis of (q15) was reacted with methanesulfonamide in acetonitrile in the presence of triethylamine and 4-dimethylaminopyridine. The reaction mixture was subjected to crystallization with water. Thereafter, the target compound was extracted with ethyl acetate and purified by silica gel column chromatography to obtain monomer (q31) as the target compound.

Synthesis of Monomer (q43)

Monomer (q43) was synthesized in the same manner as in the synthesis of (q1), except that Calenz MOI (methacrylic ester of ethyl isocyanate) was used in place of the methacryloyl chloride in the synthesis of (q1) and reacted under basic conditions.

The following Synthesis Examples describe the syntheses of alkali-soluble resins (ii) for use in the composition of the present invention.

Synthesis of Resin A

A solution prepared by dissolving 11.8 g of 2-methyl-2-adamantyl methacrylate, 7.3 g of 3-oxocyclohexyl methacrylate, 1.6 g of monomer (ql), and 1.25 g of V-65 (2,2'-azobis(2,4-dimethylvaleronitrile)), manufactured by Wako Pure Chemical Industries, Ltd., in 80 g of N,N-dimethylacetamide was dropwise added over 2 hours to 10 g of tetrahydrofuran placed in a three-necked flask heated to 60° C.

After completion of the addition, the reaction mixture was stirred for 4 hours with heating at 60° C. Thereafter, 500 mg of V-65 was added thereto and the resultant mixture was further heated for 4 hours.

After completion of the reaction, the reaction mixture was cooled to room temperature and then poured into 3 L of distilled water. The resultant precipitate was taken out by filtration and dried to obtain 20 g of a white powder of resin A as the target compound.

The weight-average molecular weight of this resin A was measured by gel permeation chromatography (GPC), and was found to be 8,900 in terms of the molecular weight calculated for standard polystyrene.

Synthesis of Resin B

Resin B was synthesized in the same manner as in the synthesis of resin A, except that a solution prepared by dissolving 10.5 g of 2-methyl-2-adamantyl methacrylate, 8.9 g of mevalonolactone methacrylate, 1.6 g of monomer (q1), and 1.25 g of V-65, manufactured by Wako Pure Chemical Industries, Ltd., in 80 g of N,N-dimethylacetamide was dropwise added in the same manner.

The weight-average molecular weight of this resin B was measured by GPC, and was found to be 9,200 in terms of the molecular weight calculated for standard polystyrene.

Synthesis of Resin C

Resin C was synthesized by the same synthesis method as that described in JP-A-9-73173, page 27, Example 7, except that 2-methyl-2-adamantyl methacrylate, 3-oxocyclohexyl methacrylate, and monomer (q1) were used as feed monomers in a ratio of 4/5/1 and that the solvent was replaced with N,N-dimethylacetamide.

The weight-average molecular weight of this resin C was measured by GPC, and was found to be 13,400 in terms of the molecular weight calculated for standard polystyrene.

Synthesis of Resin D

Resin D was synthesized in the same manner as in the synthesis of resin A, except that a solution prepared by dissolving 10.5 g of 2-methyl-2-adamantyl methacrylate, 8.9 g of mevalonolactone methacrylate, 3.0 g of monomer (q7), and 1.25 g of V-65, manufactured by Wako Pure Chemical Industries, Ltd., in 90 g of N,N-dimethylacetamide was dropwise added in the same manner.

The weight-average molecular weight of this resin D was measured by GPC, and was found to be 8,200 in terms of the molecular weight calculated for standard polystyrene.

Synthesis of Resin E

Resin E was synthesized in the same manner as in the synthesis of resin A, except that a solution prepared by dissolving 9.8 g of 2-methyl-2-adamantyl methacrylate, 8.7 g of 3-oxocyclohexyl methacrylate, 2.4 g of monomer (q15), and 1.25 g of v-65, manufactured by Wako Pure Chemical Industries, Ltd., in 90 g of N,N-dimethylacetamide was dropwise added in the same manner.

The weight-average molecular weight of this resin E was measured by GPC, and was found to be 8,200 in terms of the molecular weight calculated for standard polystyrene.

Synthesis of Resin F

Resin F was synthesized by the same synthesis method as that described in JP-A-9-90637, page 18, except that the feed monomers were replaced with 5.3 g of 2-methyl-2-adamantyl methacrylate, 4.5 g of mevalonolactone methacrylate, and 1.3 g of monomer (q31) and that the solvent was replaced with N,N-dimethylacetamide.

The weight-average molecular weight of this resin F was measured by GPC, and was found to be 13,200 in terms of the molecular weight calculated for standard polystyrene.

Synthesis of Resin G

Resin G was synthesized in the same manner as in the synthesis of resin A, except that a solution prepared by dissolving 10.5 g of 2-methyl-2-adamantyl methacrylate, 8.9 g of mevalonolactone methacrylate, 2.5 g of monomer (q43), and 1.25 g of V-65, manufactured by Wako Pure Chemical Industries, Ltd., in 90 g of N,N-dimethylacetamide was dropwise added in the same manner.

The weight-average molecular weight of this resin G was measured by GPC, and was found to be 8,600 in terms of the molecular weight calculated for standard polystyrene.

Synthesis of Comparative Resin H

Resin H was synthesized according to the synthesis method described in JP-A-9-73173, page 27, Example 7. Namely, the procedure was as follows. 2-Methyladamantyl methacrylate monomer and 3-oxocyclohexyl methacrylate monomer were introduced in a ratio of 4:6 into a polymerizer. The monomers were dissolved in toluene in a concentration of 2 mol/L. To this toluene solution was added AIBN as a polymerization initiator in an amount of S mol % to polymerize the monomers at 80° C. for about 8 hours. After completion of the polymerization, the reaction product was purified using methanol as a precipitant. As a result, a 2-methyladamantyl methacrylate/3-oxocyclohexyl methacrylate copolymer represented by the following formula was obtained. The copolymer obtained had a monomer unit ratio (m:n) of 49:51, a weight-average molecular weight ($M_w$) of 15,000, and a dispersity ratio ($M_w/M_n$) of 2.4.

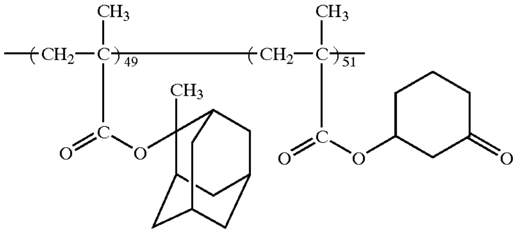

Synthesis of Comparative Resin I

Resin I was synthesized according to the synthesis method described in JP-A-9-90637, page 18, Example 13. Namely, a (±)-mevalonolactone methacrylate/2-methyl-2-adamantyl methacrylate copolymer was synthesized in the following manner.

Into a sufficiently dried, 100-mL eggplant type flask containing a Teflon-coated stirrer bar were introduced 4.96 g (25 mmol) of (±)-mevalonolactone methacrylate, 5.87 g (25 mmol) of 2-methyl-2-adamantyl methacrylate, 16.7 mL of dioxane, and 1.23 g (9 mmol) of azobisisobutyronitrile (AIBN). The contents were stirred in a nitrogen atmosphere at 80° C. for 8 hours. The reaction mixture was diluted with tetrahydrofuran (THF) and then dropped into 1 L of methanol containing a small amount of hydroquinone. The resultant precipitate was taken out by filtration with a glass filter and dried at 0.1 mmHg and 45° C. for 16 hours. The white powder obtained was dissolved in THF and the same precipitation/drying operation as described above was repeatedly conducted twice to obtain the target copolymer as a white powder. Yield=7.44 g (68.7%). The copolymer obtained had a lactone/adamantyl copolymerization ratio of 46.5/53.5, a weight-average molecular weight (calculated for standard polystyrene) of 14,000, and a dispersity ratio of 2.0.

EXAMPLES 31 TO 37

To 1.4 g of each of the resins shown in Table 6 synthesized in Synthesis Examples given above were added 0.18 g of a photo-acid generator and 10 mg of 1,5-diazabicyclo[4.3.0]-5-nonene (DBN) Each mixture was dissolved in propylene glycol monoethyl ether acetate in a solid concentration of 14 wt %. These solutions were filtered through a 0.1-μm microfilter to prepare positive photoresist composition solutions for far ultraviolet exposure.

In Table 6, PAG-1 represents triphenylsulfonium triflate and PAG-2 represents (PAG 4-35) synthesized above.

COMPARATIVE EXAMPLE 3

A positive photoresist composition solution was prepared in the same manner as in Example 31, except that resin H was used in place of the resin used in Example 31.

COMPARATIVE EXAMPLE 4

A positive photoresist composition solution was prepared in the same manner as in Example 31, except that resin I was used in place of the resin used in Example 31.

(Evaluation Test)

Each of the positive photoresist composition solutions obtained was applied to a silicon wafer with a spin coater, and the coating was dried at 120° C. for 90 seconds to form a positive photoresist film having a thickness of about 0.5 μm. These photoresist films were exposed with an ArF excimer laser (a stepper having a wavelength of 193 nm and an NA of 0.55). After the exposure, the resist films were heated at 130° C. for 90 seconds, developed with a 2.38% aqueous solution of tetramethylammonium hydroxide, and then rinsed with distilled water to obtain resist pattern profiles.

[Defocus Latitude Depended on Line Pitch]: In each of a line-and-space pattern (a pattern having densely disposed lines) and an isolated-line pattern (a pattern having thinly disposed lines) each having a line width of 0.25 μm, the focus latitude overlap range having a tolerance of 0.25 μm±10% was determined. The larger the range, the better the defocus latitude depended on line pitch.

The results of the above evaluation are shown in Table 6.

TABLE 6

| | Resin | Photo-acid generator | Defocus Latitude Depended on Line Pitch |
|---|---|---|---|
| Example 31 | A | PAG-1 | 1.0 μm |
| Example 32 | B | PAG-2 | 1.1 μm |
| Example 33 | C | PAG-1 | 1.1 μm |
| Example 34 | D | PAG-1 | 1.0 μm |
| Example 35 | E | PAG-1 | 1.0 μm |
| Example 36 | F | PAG-1 | 1.0 μm |
| Example 37 | G | PAG-2 | 1.1 μm |
| Comparative Example 3 | H | PAG-1 | 0.2 μm |
| Comparative Example 4 | I | PAG-1 | 0 μm |

As apparent from the results given in Table 6, the photoresist compositions of the Comparative Examples each showed poor defocus latitude depended on line pitch. In contrast, the positive photoresist compositions according to the present invention were on a satisfactory level with respect to the defocus latitude depended on line pitch. Namely, the resist compositions of the invention were suitable for use in lithography using far ultraviolet rays including ArF excimer laser light.

As demonstrated above, the positive photoresist composition for far ultraviolet exposure of the present invention is sufficiently suitable for exposure to a light having a wavelength especially in the range of from 170 to 220 nm, has satisfactory defocus latitude depended on line pitch and excellent sensitivity, and gives a satisfactory resist pattern profile with few development defects.

While the invention has been described in detail and with reference to specific embodiments thereof, it will be apparent to one skilled in the art that various changes and modifications can be made therein without departing from the spirit and scope thereof.

What is claimed is:

1. A positive resist fluid comprising a resin which contains groups which decompose by the action of an acid and repeating units represented by the following general formula (I) and comes to have an increased rate of dissolution in an alkaline developing solution by the action of an acid, a compound which generates an acid upon irradiation with actinic rays or a radiation, and a solvent:

(I)

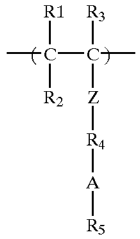

wherein $R_1$ to $R_3$ each independently represents a hydrogen atom, an alkyl group, a halogen atom, a cyano group, or a group represented by $Z—R_4—A—R_5$ Z represents a single bond, an ether group, an ester group, an amide group, an alkylene group, or a bivalent group consisting of a combination of two or more of these, $R_4$ represents a single bond, an alkylene group, an arylene group, or a bivalent group consisting of a combination of two or more of these, $R_5$ represents an alkyl group, an aryl group, or an aralkyl group, and A represents any one of the following functional groups:

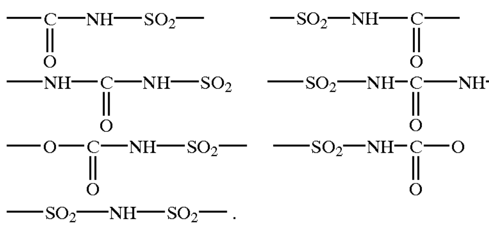

and

2. The positive resist fluid of claim 1, wherein the polymer is represented by the following general formula (Ia):

(Ia)

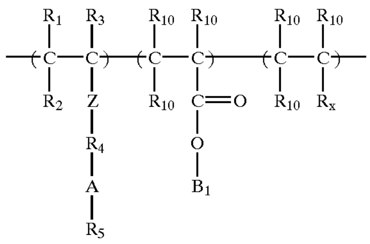

wherein $R_1$ to $R_3$, $R_4$, $R_5$, A, and Z each have the same meanings as in general formula (I), $B_1$ represents a univalent alicyclic group, Rx represents an acid-decomposable group, and $R_{10}$'s may be the same or different and each represents a hydrogen atom or an optionally substituted, linear or branched alkyl group having 1 to 4 carbon atoms.

3. The positive resist fluid of claim 1, wherein the polymer is a polymer represented by the following general formula (Ib):

(Ib)

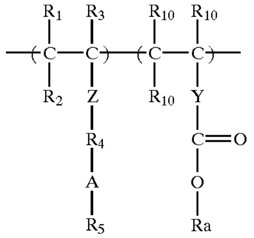

wherein $R_1$ to $R_3$, $R_4$, $R_5$, A, and Z each have the same meanings as in general formula (I), $R_{10}$'s may be the same or different and each represents a hydrogen atom or an optionally substituted, linear or branched alkyl group having 1 to 4 carbon atoms, Y represents one member or a combination of two or more members selected from the group consisting of a single bond, an alkylene group, a substituted alkylene group, an ether group, a thioether group, a carbonyl group, and an ester group, and Ra represents at least one group selected from groups represented by the following formulae (RaI) to (RaVI):

(RaI)

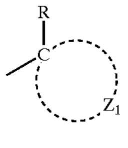

(RaII)

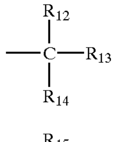

(RaIII)

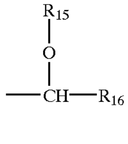

-continued (RaIV)

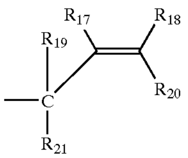

(RaV)

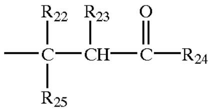

(RaVI)

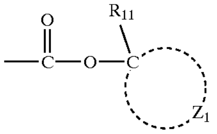

wherein $R_{11}$ represents methyl, ethyl, n-propyl, isopropyl, n-butyl, isobutyl, or sec-butyl, $Z_1$ represents a group of atoms necessary for forming an alicyclic group in cooperation with the carbon atom, $R_{12}$ to $R_{16}$ each independently represents a linear or branched alkyl group having 1 to 4 carbon atoms or an alicyclic group, provided that at least one of $R_{12}$ to $R_{14}$ or either of $R_{15}$ and $R_{16}$ represents an alicyclic group, $R_{17}$ to $R_{21}$ each independently represents a hydrogen atom, a linear or branched alkyl group having 1 to 4 carbon atoms, or an alicyclic group, provided that at least one of $R_{17}$ to $R_{21}$ represents an alicyclic group and either of $R_{19}$ and $R_{21}$ represents a linear or branched alkyl group having 1 to 4 carbon atoms or an alicyclic group, and $R_{22}$ to $R_{25}$ each independently represents a linear or branched alkyl group having 1 to 4 carbon atoms or an alicyclic group, provided that at least one of $R_{22}$ to $R_{25}$ represents an alicyclic group.

4. The positive resist fluid of claim 1, wherein the polymer is a polymer represented by the following general formula (Ic):

(Ic)

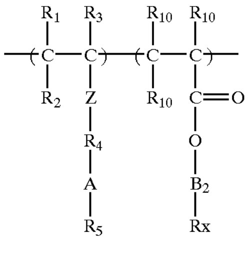

wherein $R_1$ to $R_3$, $R_4$, $R_5$, A, and Z respectively have the same meanings as in general formula (I), $B_2$ represents either a bivalent alkylene group containing an alicyclic group or a bivalent alicyclic group, Rx represents an acid-decomposable group, $R_{10}$'s may be the same or different and each represents a hydrogen atom or an optionally substituted, linear or branched alkyl group having 1 to 4 carbon atoms.

5. A positive photoresist composition for far ultraviolet exposure which comprises (i) a compound which generates an acid upon irradiation with actinic rays or a radiation and (ii) a resin which contains both alkali-soluble groups protected by groups containing an alicyclic hydrocarbon structure and represented by at least one of the following general formulae (pI) to (pVI) and groups represented by general formula (qI): —A—X—$R_5$, and which decomposes by the action of an acid to have enhanced solubility in an alkali:

(pI)

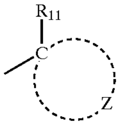

(pII)

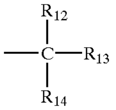

(pIII)

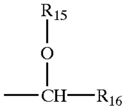

(pIV)

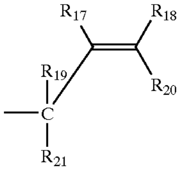

(pV)

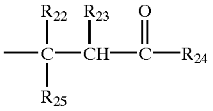

(pVI)

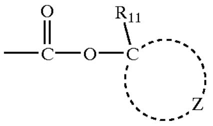

provided that in general formulae (pI) to (pVI), $R_{11}$ represents a methyl, ethyl, n-propyl, isopropyl, n-butyl, isobutyl, or sec-butyl group; Z represents a group of atoms necessary for forming an alicyclic hydrocarbon group in cooperation with the carbon atom;

$R_{12}$ to $R_{16}$ each independently represents a linear or branched alkyl group having 1 to 4 carbon atoms or an alicyclic hydrocarbon group, provided that at least one of $R_{12}$ to $R_{14}$ or either of $R_{15}$ and $R_{16}$ represents an alicyclic hydrocarbon group;

$R_{17}$ to $R_{21}$ each independently represents a hydrogen atom, a linear or branched alkyl group having 1 to 4 carbon atoms, or an alicyclic hydrocarbon group, provided that at least one of $R_{17}$ to $R_{21}$ represents an alicyclic hydrocarbon group and either of $R_{19}$ and $R_{21}$, represents a linear or branched alkyl group having 1 to 4 carbon atoms or an alicyclic hydrocarbon group; and $R_{22}$ to $R_{25}$ each independently represents a linear or branched alkyl group having 1 to 4 carbon atoms or an alicyclic hydrocarbon group, provided that at least one of $R_{22}$ to $R_{25}$ represents an alicyclic hydrocarbon group, and in general formula (qI), A represents one member or a combination of two or more members selected from the group consisting of a single bond, an alkylene group, a substituted alkylene group, an ether group, a thioether group, a carbonyl group, and an ester group;

X represents —$NHSO_2$—, —$SO_2NH$-, —$SO_2NHSO_2$—, —NH(C=O)$NHSO_2$—, —(C=O)$NHSO_2$—, —$SO_2NH$(C=O)—, —$SO_2NH$(C=O)NH—, —O(C=O)$NHSO_2$—, or —$SO_2NH$(C=O) O—; and $R_5$ represents an alkyl group, a substituted alkyl group, an alicyclic hydrocarbon group, or a substituted alicyclic hydrocarbon group.

6. The positive resist fluid as in claim 1, wherein the groups which decompose by the action of an acid are groups represented by —$COOA^0$ or —O—$B^0$; and $A^0$ represents —C($R^{01}$)($R^{02}$)($R^{03}$), —Si($R^{01}$)($R^{02}$)($R^{03}$), —C($R^{04}$)($R^{05}$)—O—$R^{06}$ or a lactone group; $B^0$ represents —$A^0$ or —$COOA^0$; $R^{01}$, $R^{02}$, $R^{03}$, $R^{04}$ and $R^{05}$ which may be the same or different, each represents a hydrogen atom, an alkyl group, a cycloalkyl group, an alkenyl group, an aralkyl group or an aryl group; and $R^{06}$ represents an alkyl group, a cycloalkyl group or an aryl group; provided that at least two of $R^{01}$ to $R^{03}$ are not hydrogen atoms; and two of $R^{01}$ to $R^{03}$ may be bonded to each other to form a ring and two of $R^{04}$ to $R^{06}$ may be bonded to each other to form a ring.

7. The positive resist fluid as in claim 1, wherein the groups which decompose by the action of an acid are groups represented by —$R^0$—$COOA^0$ or —Ar—O—$B^0$; and $A^0$ represents —C($R^{01}$)($R^{02}$)($R^{03}$), —Si($R^{01}$)($R^{02}$)($R^{03}$), —C($R^{04}$)($R^{05}$)—O—$R^{06}$ or a lactone group $B^0$ represents —$A^0$ or —$COOA^0$; $R^{01}$, $R^{02}$, $R^{03}$, $R^{04}$ and $R^{05}$ which may be the same or different, each represents a hydrogen atom, an alkyl group, a cycloalkyl group, an alkenyl group, an aralkyl group or an aryl group; and $R^{06}$ represents an alkyl group, a cycloalkyl group or an aryl group; provided that at least two of $R^{01}$ to $R^{03}$ are not hydrogen atoms; and two of $R^{01}$ to $R^{03}$ may be bonded to each other to form a ring and two of $R^{04}$ to $R^{06}$ may be bonded to each other to form a ring; $R^0$ represents a single bond or an optionally substituted, aliphatic or aromatic hydrocarbon group having a valence of 2 or higher; and —Ar— represents an optionally substituted mono- or polycyclic aromatic group having a valence of 2 or higher.

* * * * *